(12) United States Patent
Hu et al.

(10) Patent No.: US 10,885,822 B2
(45) Date of Patent: Jan. 5, 2021

(54) GATE DRIVING CIRCUIT AND DISPLAY PANEL

(71) Applicant: HannStar Display Corporation, Taipei (TW)

(72) Inventors: Hsien-Tang Hu, Taichung (TW); Hsuan-Chen Liu, Kaohsiung (TW); Chien-Ting Chan, Tainan (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 16/396,787

(22) Filed: Apr. 29, 2019

(65) Prior Publication Data

US 2019/0340969 A1 Nov. 7, 2019

(30) Foreign Application Priority Data

May 3, 2018 (CN) .......................... 2018 1 0415834

(51) Int. Cl.
| | |
|---|---|
| *G09G 3/3266* | (2016.01) |
| *G09G 3/36* | (2006.01) |
| *G09G 3/20* | (2006.01) |
| *G11C 19/28* | (2006.01) |

(52) U.S. Cl.
CPC .............. *G09G 3/20* (2013.01); *G09G 3/3266* (2013.01); *G09G 3/3677* (2013.01); *G11C 19/287* (2013.01); *G09G 2300/0426* (2013.01); *G09G 2310/0286* (2013.01); *G09G 2310/08* (2013.01)

(58) Field of Classification Search
CPC .. G09G 3/3677; G09G 3/3266; G09G 3/3674; G09G 2310/0286; G11C 19/287
See application file for complete search history.

(56) References Cited

U.S. PATENT DOCUMENTS

| | | | |
|---|---|---|---|
| 2009/0040203 A1* | 2/2009 | Kim ..................... | G09G 3/3677 345/204 |
| 2016/0240265 A1* | 8/2016 | Yu ........................ | G09G 3/3677 |

FOREIGN PATENT DOCUMENTS

KR 101768541 B1 8/2017

* cited by examiner

*Primary Examiner* — Xuemei Zheng
(74) *Attorney, Agent, or Firm* — CKC & Partners Co., LLC

(57) ABSTRACT

A gate driving circuit and a display panel with the gate driving circuit are provided. The gate driving circuit includes shift registers for providing scan signals to gate lines of the display panel. Each shift register includes a main circuit and a discharge circuit. In the main circuit, a pre-charge unit is coupled to a first node and is configured to output a pre-charge signal to the first node, a pull-up unit is coupled to the first node and a second node and is configured to output an $m^{th}$ stage scan signal of the $1^{st}$ to $N^{th}$ stage scan signals to the second node; and a reset unit is coupled to the first node and is configured to receive a reset signal. In the discharge circuit, a pull-down unit is coupled to the first node and the second node and is configured to receive a pull-down control signal.

15 Claims, 17 Drawing Sheets

GATE DRIVING CIRCUIT AND DISPLAY PANEL

RELATED APPLICATIONS

This application claims priority to Chinese Application Serial Number 201810415834.7 filed May 3, 2018, which is herein incorporated by reference.

BACKGROUND

Field of Invention

The present invention relates to a gate driving circuit, and more particularly to a gate driving circuit with a voltage level reset function and a display panel that has the gate driving circuit.

Description of Related Art

A flat panel display device, such as a liquid crystal display (LCD) device or an organic light-emitting diode (OLED) display device, generally has a lot of shift registers for controlling gray levels of all pixels displayed on the display device at the same time point. On the other hand, the accuracy of signals correspondingly outputted at each time point has to be considered in an electrical circuit design of a shift register for ensuring image display quality of a display device with the shift register. However, if the waveforms of the scan signals outputted by the shift registers have errors, the display device will be caused to display incorrect image data. In addition, high-definition (HD) and medium- to large-scale flat panel display devices is likely to have image display problems caused by noise interference on the shift registers, such as stripes and flickers.

SUMMARY

An objective of the invention is to provide a gate driving circuit and a display panel with the gate driving circuit, in which the gate driving circuit has a voltage level reset function for preventing shift registers from being affected by noise interferences to output abnormal scan signals, thus ensuring the display panel to display correct images in each frame period.

One aspect of the invention is directed to a gate driving circuit which includes $1^{st}$ to $N^{th}$ stage shift registers, where N is an integer greater than or equal to 4. The $1^{st}$ to $N^{th}$ stage shift registers are configured to respectively provide $1^{st}$ to $N^{th}$ stage scan signals to $1^{st}$ to $N^{th}$ gate lines of a display panel. An $m^{th}$ stage shift register of the $1^{st}$ to $N^{th}$ stage shift registers includes an $m^{th}$ main circuit and an $m^{th}$ discharge circuit, where m is an integer that is greater than or equal to 1 and less than or equal to N. The $m^{th}$ main circuit includes an $m^{th}$ pre-charge unit, an $m^{th}$ pull-up unit and an $m^{th}$ reset unit. The $m^{th}$ pre-charge unit is coupled to a first node and is configured to output a pre-charge signal to the first node. The $m^{th}$ pull-up unit is coupled to the first node and a second node and is configured to output an $m^{th}$ stage scan signal of the $1^{st}$ to $N^{th}$ stage scan signals to the second node. The $m^{th}$ reset unit is coupled to the first node and is configured to receive a reset signal. The $m^{th}$ discharge circuit includes an $m^{th}$ pull-down unit that is coupled to the first node and the second node and is configured to receive a pull-down control signal.

In one embodiment of the invention, an $i^{th}$ main circuit is coupled to an $(i+1)^{th}$ discharge circuit, and an $i^{th}$ discharge circuit is coupled to an $(i+1)^{th}$ main circuit, where i is an odd number greater than or equal to 1 and less than or equal to N.

In one embodiment of the invention, the $(i+1)^{th}$ discharge circuit is coupled to the first node and the second node of the $i^{th}$ main circuit, and the $i^{th}$ discharge circuit is coupled to the first node and the second node of the $(i+1)^{th}$ main circuit.

In one embodiment of the invention, the $m^{th}$ reset unit is configured to reset a voltage level of the first node after the gate driving circuit generates the $1^{st}$ to $N^{th}$ stage scan signals.

In one embodiment of the invention, the $m^{th}$ reset unit is configured to reset the voltage level of the first node after the gate driving circuit generates the $1^{st}$ to $N^{th}$ stage scan signals in a $j^{th}$ frame period and before the gate driving circuit generates the $1^{st}$ stage scan signals in a $(j+1)^{th}$ frame period, wherein j is integer that is greater than or equal to 1.

In one embodiment of the invention, the $m^{th}$ reset unit is configured to reset a voltage level of the first node before the display panel displays a first frame after the display panel enters a display status.

In one embodiment of the invention, the $m^{th}$ precharge unit includes a first transistor and a second transistor. A control terminal of the first transistor is configured to receive a first input signal, a first terminal of the first transistor is configured to receive a first reference voltage level, and a second terminal of the first transistor is coupled to the first node. A control terminal of the second transistor is configured to receive a second input signal, a first terminal of the second transistor is configured to receive a second reference voltage signal, and a second terminal of the second transistor is coupled to the first node.

In one embodiment of the invention, when m is any integer of 1 to 2, the first input signal is a starting signal, and the second input signal is an $(m+3)^{th}$ stage scan signal of the $1^{st}$ to $N^{th}$ stage scan signals; when m is any integer of 3 to (N−3), the first input signal is an $(m-2)^{th}$ stage scan signal of the $1^{st}$ to $N^{th}$ stage scan signals, and the second input signal is an $(m+3)^{th}$ stage scan signal of the $1^{st}$ to $N^{th}$ stage scan signals; when m is any integer of (N−2) to N, the first input signal is an $(m-2)^{th}$ stage scan signal of the $1^{st}$ to $N^{th}$ stage scan signals, and the second input signal is an ending signal.

In one embodiment of the invention, the $m^{th}$ pull-up unit includes a third transistor. A control terminal of the third transistor is coupled to the first node, a first terminal of the third transistor is configured to receive a clock signal, and a second terminal of the third transistor is configured to output the $m^{th}$ stage scan signal.

In one embodiment of the invention, the $m^{th}$ reset unit includes a reset transistor. A control terminal of the reset transistor is configured to receive the reset signal, a first terminal of the reset transistor is configured to receive a reference voltage level, and a second terminal of the reset transistor is coupled to the first node.

In one embodiment of the invention, an $i^{th}$ pull-down unit is configured to receive a first pull-down control signal, an $(i+1)^{th}$ pull-down unit is configured to receive a second pull-down control signal, and the first pull-down control signal and the second pull-down control signal are phase-inverted with respect to each other during an image display period of the display panel, wherein i is an odd number greater than or equal to 1 and less than or equal to N.

Another aspect of the invention is directed to a display panel that has a display area and a non-display area and includes a substrate, $1^{st}$ to $N^{th}$ gate lines, a first gate driving circuit and a first reset signal line. The $1^{st}$ to $N^{th}$ gate lines are disposed on the substrate and in the display area. The first gate driving circuit is disposed on the substrate and in the non-display area and includes $1^{st}$ to $N^{th}$ stage shift registers that are configured to respectively provide $1^{st}$ to $N^{th}$ stage first scan signals to the $1^{st}$ to $N^{th}$ gate lines in the display area, where N is an integer greater than or equal to 4. The first reset signal line is disposed on the substrate and in the non-display area and is coupled to the $1^{st}$ to $N^{th}$ stage shift registers. An $m^{th}$ stage shift register of the $1^{st}$ to $N^{th}$ stage shift registers comprises an $m^{th}$ main circuit and an $m^{th}$ discharge circuit, where m is an integer that is greater than or equal to 1 and less than or equal to N. The $m^{th}$ main circuit includes an $m^{th}$ pre-charge unit, an $m^{th}$ pull-up unit and an $m^{th}$ reset unit. The $m^{th}$ pre-charge unit is coupled to a first node and is configured to output a pre-charge signal to the first node. The $m^{th}$ pull-up unit that is coupled to the first node and a second node and is configured to output an $m^{th}$ stage first scan signal of the $1^{st}$ to $N^{th}$ stage first scan signals to the second node. The $m^{th}$ reset unit that is coupled to the first node, where the first reset signal line is configured to provide a reset signal to the $m^{th}$ reset unit. The $m^{th}$ discharge circuit includes an $m^{th}$ pull-down unit that is coupled to the first node and the second node and is configured to receive a pull-down control signal.

In one embodiment of the invention, an $i^{th}$ main circuit is coupled to an $(i+1)^{th}$ discharge circuit, and an $i^{th}$ discharge circuit is coupled to an $(i+1)^{th}$ main circuit, where i is an odd number greater than or equal to 1 and less than or equal to N.

In one embodiment of the invention, the $m^{th}$ precharge unit includes a first transistor and a second transistor, the $m^{th}$ pull-up unit includes a third transistor, and the $m^{th}$ reset unit includes a reset transistor. The first transistor is configured to receive a first input signal and is coupled to the first node. The second transistor is configured to receive a second input signal and is coupled to the first node. The third transistor is coupled to the first node and the second node and is configured to receive a clock signal and output the $m^{th}$ first scan signal. The reset transistor is coupled to the first node and is disposed between the second transistor and the third transistor and is configured to receive the reset signal.

In one embodiment of the invention, the display panel further includes a wiring that is disposed between the first reset signal line and a control terminal of the reset transistor and is electrically connected to the first reset signal line and the control terminal of the reset transistor. The wiring and the first reset signal line are formed from different metal layers.

In one embodiment of the invention, the first reset signal line is disposed between the display area and the $1^{st}$ to $N^{th}$ stage shift registers.

In one embodiment of the invention, the display panel further includes a second gate driving circuit and a second reset signal line that are disposed on the substrate and in the non-display area. The first gate driving circuit and the second gate driving circuit are disposed respectively at two opposite sides of the display panel, and the first reset signal line and the second reset signal line are disposed respectively at two opposite sides of the display panel. The first gate driving circuit and the second gate driving circuit have the same circuit, the second reset signal line is coupled to $1^{st}$ to $N^{th}$ stage shift registers of the second gate driving circuit, and the second gate driving circuit is configured to provide $1^{st}$ to $N^{th}$ stage second scan signals to the $1^{st}$ to $N^{th}$ gate lines. One end and the other end of each of the $1^{st}$ to $N^{th}$ gate lines are respectively coupled to the first gate driving circuit and the second gate driving circuit, and waveforms and time sequences of the $1^{st}$ to $N^{th}$ stage first scan signals are respectively the same as waveforms and time sequences of the $1^{st}$ to $N^{th}$ stage second scan signals.

Yet another aspect of the invention is directed to a gate driving circuit which includes $1^{st}$ to $N^{th}$ stage shift registers, where N is an integer greater than or equal to 4. The $1^{st}$ to $N^{th}$ stage shift registers configured to respectively provide $1^{st}$ to $N^{th}$ stage scan signals to $1^{st}$ to $N^{th}$ gate lines of a display panel. An $i^{th}$ stage shift register of the $1^{st}$ to $N^{th}$ stage shift registers includes an $i^{th}$ main circuit and an $i^{th}$ discharge circuit, an $(i+1)^{th}$ stage shift register of the $1^{st}$ to $N^{th}$ stage shift registers includes an $(i+1)^{th}$ main circuit and an $(i+1)^{th}$ discharge circuit, the $i^{th}$ main circuit is coupled to the $i^{th}$ discharge circuit and the $(i+1)^{th}$ discharge circuit, and the $(i+1)^{th}$ main circuit is coupled to the $i^{th}$ discharge circuit and the $(i+1)^{th}$ discharge circuit, where i is an odd number greater than or equal to 1 and less than or equal to N.

In one embodiment of the invention, the $i^{th}$ main circuit includes an $i^{th}$ pre-charge unit and an $i^{th}$ pull-up unit, and the $(i+1)^{th}$ main circuit includes an $(i+1)^{th}$ pre-charge unit and an $(i+1)^{th}$ pull-up unit. The $i^{th}$ pre-charge unit is coupled to a first node of the $i^{th}$ stage shift register and is configured to output an $i^{th}$ pre-charge signal to the first node of the $i^{th}$ stage shift register. The $i^{th}$ pull-up unit that is coupled to the first node and a second node of the $i^{th}$ stage shift register and is configured to output an $i^{th}$ stage scan signal of the $1^{st}$ to $N^{th}$ stage scan signals to the second node of the $i^{th}$ stage shift register. The $(i+1)^{th}$ pre-charge unit that is coupled to a first node of the $(i+1)^{th}$ stage shift register and is configured to output an $(i+1)^{th}$ pre-charge signal to the first node of the $(i+1)^{th}$ stage shift register. The $(i+1)^{th}$ pull-up unit that is coupled to the first node and a second node of the $(i+1)^{th}$ stage shift register and is configured to output an $(i+1)^{th}$ stage scan signal of the $1^{st}$ to $N^{th}$ stage scan signals to the second node of the $(i+1)^{th}$ stage shift register. The $i^{th}$ discharge circuit is coupled to the first node and the second node of the $i^{th}$ main circuit and the first and second nodes of the $(i+1)^{th}$ main circuit, and the $(i+1)^{th}$ discharge circuit is coupled to the first node and the second node of the $i^{th}$ main circuit and the first node and the second node of the $(i+1)^{th}$ main circuit.

In one embodiment of the invention, the $i^{th}$ main circuit and $(i+1)^{th}$ main circuit further respectively comprise an $i^{th}$ reset unit and an $(i+1)^{th}$ reset unit, and the $i^{th}$ reset unit and the $(i+1)^{th}$ reset unit are configured to receive the reset signal and are respectively coupled to the first node of the $i^{th}$ reset unit and the first node of the $(i+1)^{th}$ reset unit.

An advantage of the present invention is at least that, with the voltage level reset function of the gate driving circuit and the display panel of the invention, the shift registers can be avoided from being affected by noise interferences to output abnormal scan signals, ensuring that the display panel displays correct images in each frame period.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

It will be understood that, although the terms "first," "second" and so on may be used herein to describe various elements, components, areas, layers and/or portions, these elements, components, areas, layers and/or portions, should not be limited by these terms. These terms are only used to distinguish elements, components, areas, layers and/or portions.

Regarding the term "coupled" used in the following description, it may be used to indicate that two or more elements are in direct physical or electrical contact with each other, or may also mean that two or more elements may not be in direct contact with each other. "Coupled" may still be used to indicate that two or more elements cooperate or interact with each other.

Figure 1:
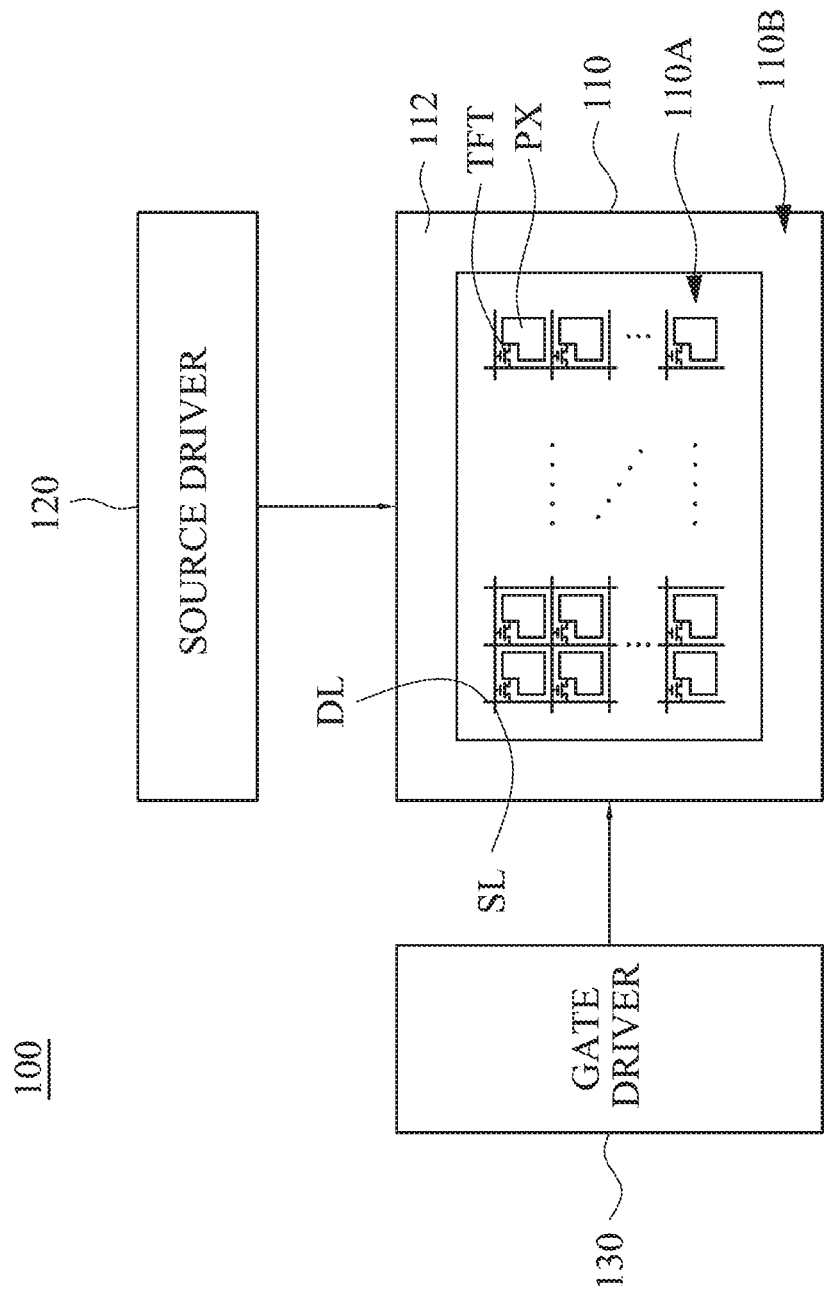
FIG. 1 is a schematic diagram of a display device in accordance with some embodiments of the invention.

Referring to FIG. 1, FIG. 1 is a schematic diagram of a display device 100 in accordance with some embodiments of the invention. The display device 100 includes a display panel 110, a source driver 120 and a gate driver 130. The display panel 110 may be, for example, a liquid crystal display (LCD) apparatus of twisted nematic (TN) mode, in-plane switching (IPS) mode, fringe-field switching (FFS) mode, vertical alignment (VA) mode or other different modes, or an organic light-emitting diode (OLED) panel. The source driver 120 is electrically connected to the display panel 110 and is configured to convert image data into source driving signals and transmit the source driving signals to the display panel 110. The gate driver 130 is configured to generate and transmit gate driving signals to the display panel 110. The display panel 110 has a display area 110A and a non-display area 110B. In the display area 110A, data lines DL, gate lines SL and pixels PX are formed on the substrate 112, and such pixels PX collectively display an image by the driving of the source driving signals and the gate driving signals. In the non-display area 110B, wirings (not shown) are respectively coupled to the source driver 120 and the gate driver 130 and are respectively coupled to the data lines DL and the gate lines SL in the display area 110A, so as to respectively send the source driving signals and the gate driving signals to thin film transistors TFT of the corresponding pixels PX, such that the pixels PX display corresponding gray levels in a particular time under the on-off switch control of the thin film transistors TFT.

Figure 2:
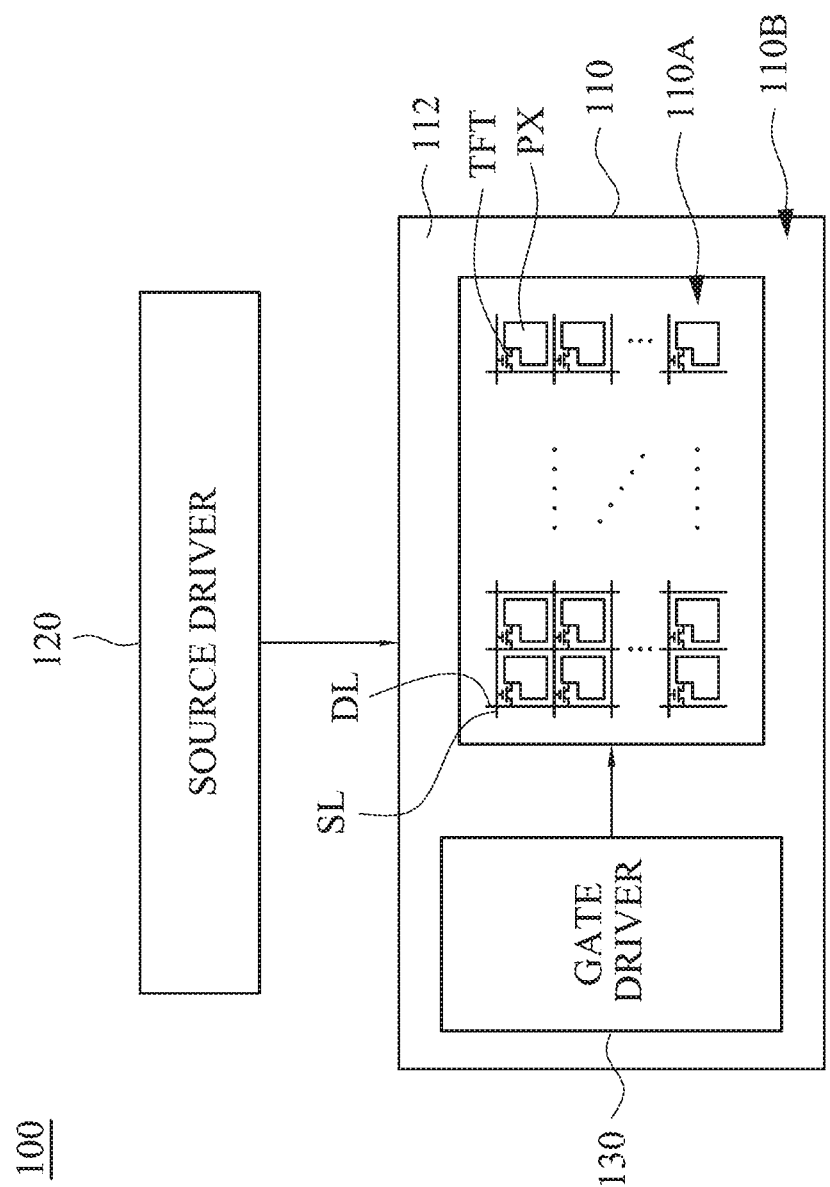
FIG. 2 is a schematic diagram of a display device in accordance with some embodiments of the invention.

The source driver 120 and/or the gate driver 130 in FIG. 1 may be integrated in the display panel 110. As shown in FIG. 2, the display device 100 of the invention may be a system on glass (SOG) panel, in which the gate driver 130 is formed in the non-display area 110B of the display panel 110. As such, the electrical components in the gate driver 130 and the display area 110A may be formed simultaneously by the same process or processes. For example, the TFTs of the gate driving circuit in the gate driver 130 and the TFTs of the pixels in the display area 110A of the display panel 110 may be formed simultaneously by the same process or processes. In other embodiments, the source driver 120 may also be formed in the non-display area 110B of the display panel 110, and the electrical components and wirings in the display panel 110, the source driver 120 and the gate driver 130 may be formed simultaneously by the same process or processes.

Figure 3:
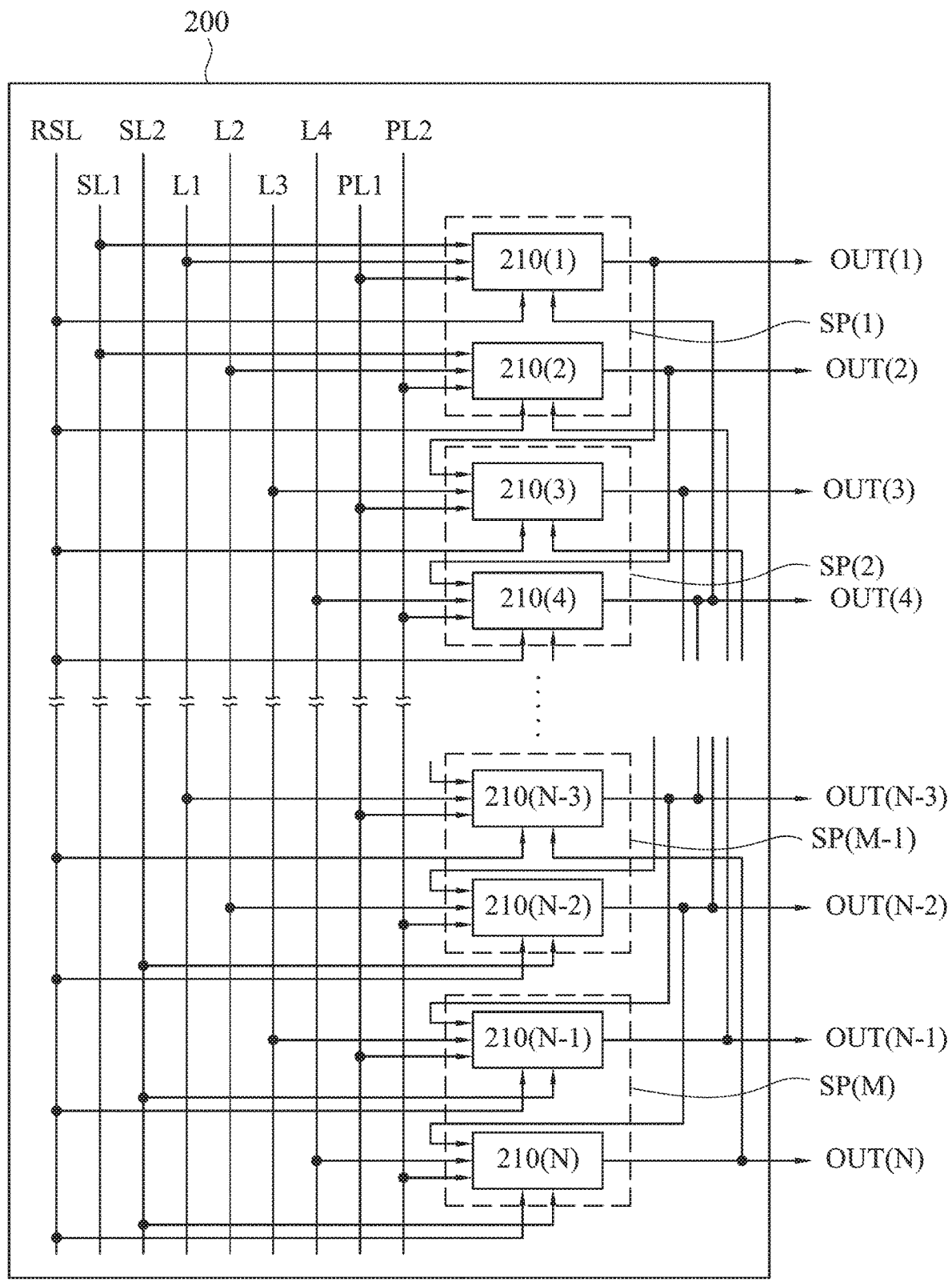
FIG. 3 is a schematic diagram of a gate driving circuit in accordance with some embodiments of the invention.

Referring to FIG. 3, which illustrates a schematic diagram of a gate driving circuit 200 in accordance with some embodiments of the invention. The gate driving circuit 200 may be applied to the display device 100 in FIG. 1 or FIG. 2, or another similar display device. In the following, the gate driving circuit 200 applied to the display device 100 in FIG. 2 is exemplified for description. The gate driving circuit 200 is a part of the gate driver 130, and receives a starting signal STV1, clock signals C1-C4, pull-down control signals GPWL1, GPWL2, an ending signal STV2 and a reset signal RST, and includes $1^{st}$ to $N^{th}$ stage shift registers 210(1)-210(N), where N is an integer greater than or equal to 4. The $1^{st}$ to $N^{th}$ stage shift registers 210(1)-210(N) are a Gate Driver on Array (GOA) structure. Further, N is an even number greater than 4, and the shift registers 210(1)-210(N) sequentially form circuit pairs SP(1)-SP(M) in units of every two neighboring shift registers, where N is two times of M. As shown in FIG. 3, the $1^{st}$ and $2^{nd}$ stage shift registers 210(1), 210(2) form the circuit pair SP(1), the $3^{rd}$ and $4^{th}$ stage shift registers 210(3), 210(4) form the circuit pair SP(2), and so on. The coupling relationship between the shift registers for each of the circuit pairs SP(1)-SP(M) will be described in FIG. 4A and FIG. 4B.

In some embodiments, the gate driving circuit 200 further includes signal lines such as a starting signal line SL1, clock signal lines L1-L4, an ending signal line SL2, pull-down control signal lines PL1, PL2 and a reset signal line RSL which respectively provide the starting signal STV1, the clock signals C1-C4, the ending signal STV2, the pull-down control signals GPWL1, GPWL2 and the reset signal RST to the corresponding shift registers. Particularly, in a case where N is a multiple of 4, the clock signal line L1 is coupled to the $1^{st}$ stage shift register 210(1), the $5^{th}$ stage shift register 210(5), ..., and the $(N-3)^{th}$ stage shift register 210(N−3), the clock signal line L2 is coupled to the $2^{nd}$ stage shift register 210(2), the $6^{th}$ stage shift register 210(6), . . . , and the (N−2)$^{th}$ stage shift register 210(N−2), the clock signal line L3 is coupled to the $3^{rd}$ stage shift register 210(3), the $7^{th}$ stage shift register 210(7), . . . , and the (N−1)$^{th}$ stage shift register 210(N−1), and the clock signal line L4 is coupled to the $4^{th}$ stage shift register 210(4), the $8^{th}$ stage shift register 210(8), . . . , and the N$^{th}$ stage shift register 210(N). As such, the clock signal lines L1-L4 respectively provide the clock signals C1-C4 to the corresponding shift registers 210(1)-210(N), such that the clock signals C1-C4 are sequentially and cyclically inputted into the shift registers 210(1)-210(N), where the clock signals C2, C3, C4 respectively lag the clock signals C1, C2, C3 by ¼ clock period.

In addition, the starting signal line SL1 provides the starting signal STV1 to the $1^{st}$ and $2^{nd}$ stage shift registers 210(1), 210(2), the ending signal line SL2 provides the ending signal STV2 to the (N−2)$^{th}$ to N$^{th}$ stage shift registers 210(N−2)-210(N), the pull-down control signal line PL1 provides the pull-down control signal GPWL1 to the odd-numbered stage shift registers 210(1), 210(3), . . . , 210(N−1), the pull-down control signal line PL2 provides the pull-down control signal GPWL2 to the even-numbered stage shift registers 210(2), 210(4), . . . , 210(N), and the reset signal line RSL provides the reset signal RST to all of the shift registers 210(1)-210(N). The starting signal line SL1, the clock signal lines L1-L4, the ending signal line SL2, the pull-down control signal lines PL1, PL2 and the reset signal line RSL may be coupled to one or more chips. That is, the starting signal STV1, the clock signals C1-C4, the ending signal STV2, the pull-down control signals GPWL1, GPWL2 and the reset signal RST may be provided by the chip(s), such as a driver chip and/or a controller chip, but are not limited thereto.

In the gate driving circuit 200, the $1^{st}$ to N$^{th}$ stage shift registers 210(1)-210(N) respectively provide $1^{st}$ to N$^{th}$ stage scan signals OUT(1)-OUT(N) for the corresponding gate lines. Moreover, the $1^{st}$ to $3^{rd}$ stage scan signals OUT(1)-OUT(3) are respectively inputted to the $3^{rd}$ to $5^{th}$ stage shift registers 210(3)-210(5), the (N−1)$^{th}$ and N$^{th}$ scan signals OUT(N−1), OUT(N) are respectively inputted to the (N−4)$^{th}$ and (N−3)$^{th}$ stage shift registers 210(N−4), 210(N−3), and each of the $4^{th}$ to (N−2)$^{th}$ stage scan signals OUT(4)-OUT(N−2) is inputted to the shift registers previous three stage of shift register thereto and next two stage of shift register thereto. For illustration, the $4^{th}$ stage scan signal OUT(4) is inputted to the $1^{st}$ and $6^{th}$ shift registers 210(1), 210(6).

Figure 4A:
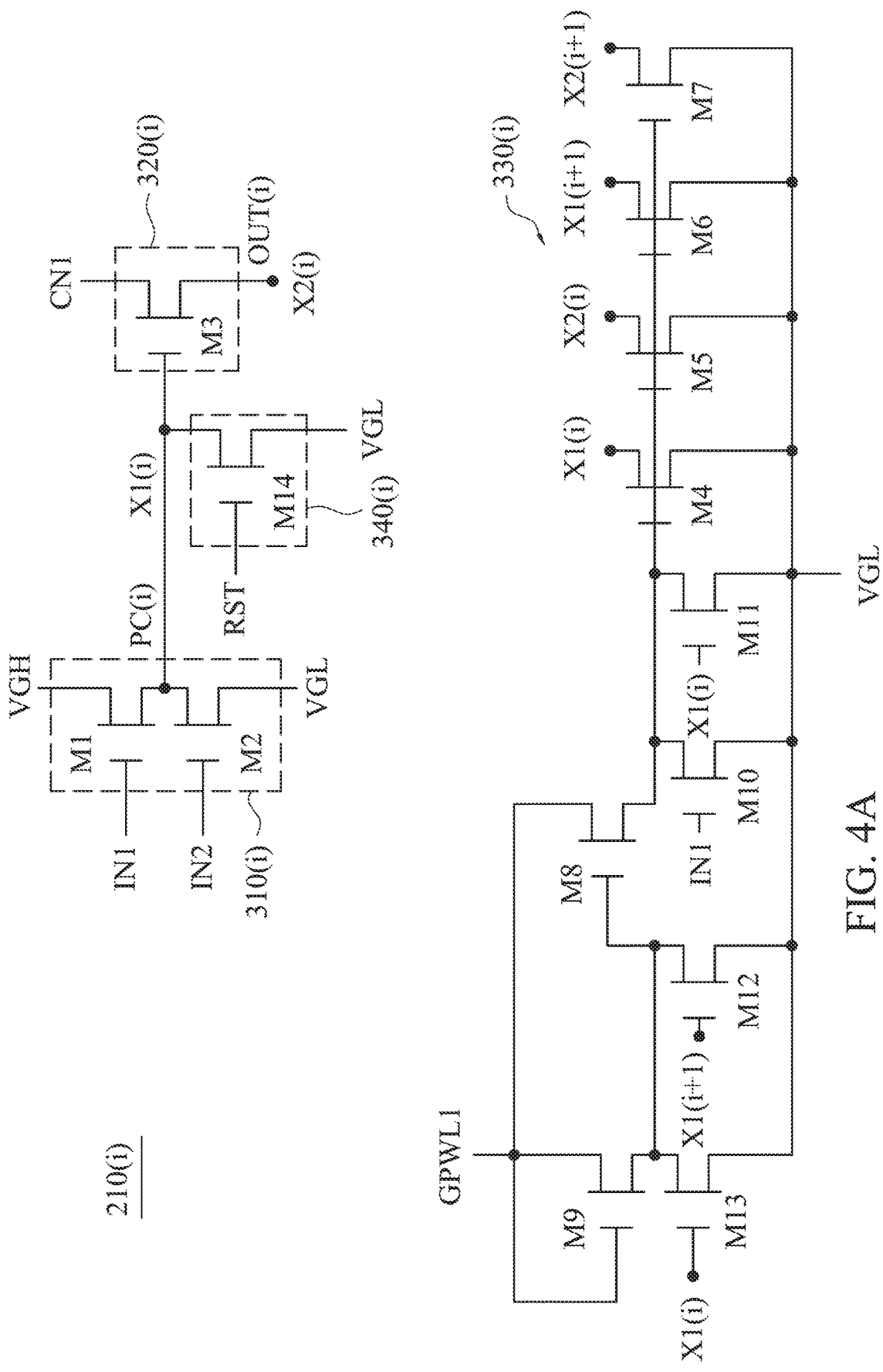
FIG. 4A is an equivalent circuit diagram of the odd-numbered stage shift register in FIG. 3.
Figure 4B:
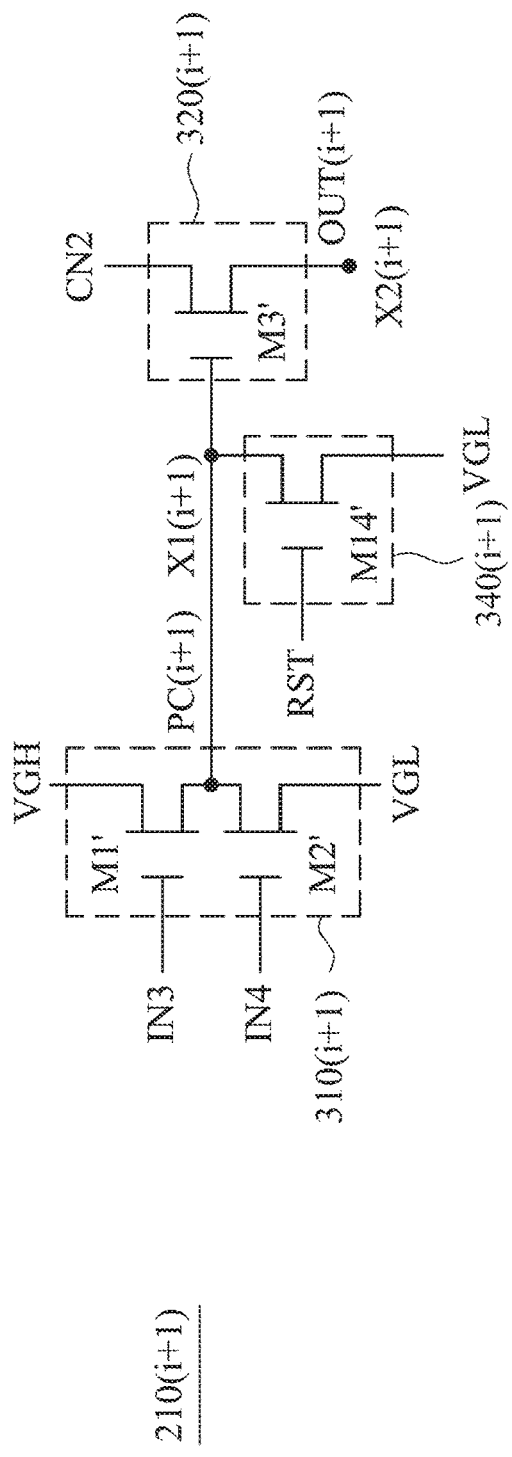
FIG. 4B is an equivalent circuit diagram of the even-numbered stage shift register in FIG. 3.

FIG. 4A and FIG. 4B are respective circuit diagrams of the i$^{th}$ stage shift register 210(i) and the (i+1)$^{th}$ stage shift register 210(i+1) of FIG. 2, where i is an odd integer from 1 to N. The i$^{th}$ stage shift register 210(i) includes a precharge unit 310(i), a pull-up unit 320(i), a pull-down unit 330(i) and a reset unit 340(i), which may be respectively referred to as an i$^{th}$ precharge unit 310(i), an i$^{th}$ pull-up unit 320(i), an i$^{th}$ pull-down unit 330(i) and an i$^{th}$ reset unit 340(i), while the (i+1)$^{th}$ stage shift register 210(i+1) includes a precharge unit 310(i+1), a pull-up unit 320(i+1), a pull-down unit 330(i+1) and a reset unit 340(i+1), which may be respectively referred to as an (i+1)$^{th}$ precharge unit 310(i+1), an (i+1)$^{th}$ pull-up unit 320(i+1), an (i+1)$^{th}$ pull-down unit 330(i+1) and an (i+1)$^{th}$ reset unit 340(i+1).

In the i$^{th}$ stage shift register 210(i) of FIG. 4A, the precharge unit 310(i) receives input signals IN1, IN2 and outputs a precharge signal PC(i) to a node X1(i) based on the input signals IN1, IN2. The control terminal of the transistor M1 receives the input signal IN1, the first terminal of the transistor M1 receives a reference voltage (as referred to as a first reference voltage) VGH (gate high voltage), and the second terminal of the transistor M1 is coupled to the node X1(i). The control terminal of the transistor M2 receives the input signal IN2, the first terminal of the transistor M2 receives a reference voltage (also referred to as a second reference voltage) VGL (gate low voltage), and the second terminal of the transistor M2 is coupled to the node X1(i). In variant embodiments, the first reference voltage and the second reference voltage can be relative high and low voltages, respectively, and the first reference voltage is different from VGH and/or the second reference voltage is different from VGL. In the context, "control terminal," "first terminal" and "second terminal" of the transistor respectively relate to the gate, the source and the drain of the transistor, or alternatively respectively relate to the gate, the drain and the source of the transistor.

In the i$^{th}$ stage shift register 210(i) of FIG. 4A, the pull-up unit 320(i) is coupled to the precharge unit 310(i), receives the precharge signal PC(i) and a clock signal CN1, and outputs the scan signal OUT(i) to a node X2(i) based on the precharge signal PC(i) and the clock signal CN1. The node X2(i) is coupled to the corresponding gate line SL (not shown in FIG. 4A) in the display panel 110 for providing the scan signal OUT(i) to the corresponding gate line SL. The pull-up unit 320(i) includes a transistor M3. The control terminal of the transistor M3 is coupled to the node X1(i), the first terminal of the transistor M3 receives the clock signal CN1, and the second terminal of the transistor M3 outputs the scan signal OUT(i). If (i+1) is a multiple of 4, the clock signal CN1 is the clock signal C3 provided by the clock signal line L3 (as shown in FIG. 3). Oppositely, if (i+1) is not a multiple of 4, the clock signal CN1 is the clock signal C1 provided by the clock signal line L1 (as shown in FIG. 3). It is noted that, in variant embodiments, the pull-up unit 320(i) may further include a capacitor, i.e., a capacitor may be coupled between the control terminal and the second terminal of the transistor M3.

In the i$^{th}$ stage shift register 210(i) of FIG. 4A, the pull-down unit 330(i) is coupled to the precharge unit 310(i) and the pull-up unit 320(i) and receives the pull-down control signal GPWL1 (also referred to as a first pull-down control signal). The pull-down unit 330(i) includes transistors M4-M13. The first terminal of the transistor M4 receives the reference voltage VGL, and the second terminal of the transistor M4 is coupled to the node X1(i) to receive the precharge signal PC(i). The control terminal of the transistor M5 is coupled to the control terminal of the transistor M4, the first terminal of the transistor M5 receives the reference voltage VGL, and the second terminal of the transistor M5 is coupled to the node X2(i) to receive the i$^{th}$ stage scan signal OUT(i). The control terminal of the transistor M6 is coupled to the control terminal of the transistor M4, the first terminal of the transistor M6 receives the reference voltage VGL, and the second terminal of the transistor M6 is coupled to the node X1(i+1) of the (i+1)$^{th}$ stage shift register 210(i+1) to receive a precharge signal PC(i+1) of the (i+1)$^{th}$ stage shift register 210(i+1). The control terminal of the transistor M7 is coupled to the control terminal of the transistor M4, the first terminal of the transistor M7 receives the reference voltage VGL, and the second terminal of the transistor M7 is coupled to a node X2(i+1) of the (i+1)$^{th}$ stage shift register 210(i+1) to receive the (i+1)$^{th}$ stage scan signal OUT(i+1). The first terminal of the transistor M8 receives the pull-down control signal GPWL1, and the second terminal of the transistor M8 is coupled to the control terminal of the transistor M4. The control terminal and the first terminal of the transistor M9 receive the pull-down control signal GPWL1, and the second terminal of the transistor M9 is coupled to the control terminal of the transistor M8. The control terminal of the transistor M10 receives the input signal IN1, the first terminal of the transistor M10 receives the reference voltage VGL, and the second terminal of the transistor M10 is coupled to the control terminal of the transistor M4. The control terminal of the transistor M11 is coupled to the node $X1(i)$ to receive the precharge signal PC(i), the first terminal of the transistor M11 receives the reference voltage VGL, and the second terminal of the transistor M11 is coupled to the control terminal of the transistor M4. The control terminal of the transistor M12 is coupled to the node $X1(i+1)$ of the $(i+1)^{th}$ stage shift register $210(i+1)$ to receive the precharge signal PC(i+1) of the $(i+1)^{th}$ stage shift register $210(i+1)$, the first terminal of the transistor M12 receives the reference voltage VGL, and the second terminal of the transistor M12 is coupled to the control terminal of the transistor M8. The control terminal of the transistor M13 is coupled to the node $X1(i)$ to receive the precharge signal PC(i), the first terminal of the transistor M13 receives the reference voltage VGL, and the second terminal of the transistor M13 is coupled to the control terminal of the transistor M8.

In the $i^{th}$ stage shift register $210(i)$ of FIG. 4A, the reset unit $340(i)$ is coupled to the precharge unit $310(i)$ and the pull-up unit $320(i)$, and resets the voltage levels of the nodes $X1(i)$, $X2(i)$ (i.e. the precharge signal PC(i) and the scan signal SC(i)) based on a reset signal RST after sequentially scanning all of the gate lines SL of the display panel 110 for each frame period. That is, for each frame period, after the last stage scan signal (the $N^{th}$ stage scan signal OUT(N) in this embodiment) is outputted, the voltage levels of the nodes $X1(i)$, $X2(i)$ are set to low-level. It is noted that, in this context, performing scanning on the gate line directs to the voltage level of the scan signal being an enabling voltage level (the high voltage level in this embodiment) for turning on the thin film transistors of the pixel row corresponding to the gate line. In addition, outputting the $i^{th}$ stage scan signal OUT(i) means enabling the $i^{th}$ stage scan signal OUT(i) to be an enabling voltage level (the high voltage level in this embodiment), such that the voltage level of the corresponding gate line is the enabling voltage level, and then the thin film transistors of the pixel row corresponding to the gate line are turned on. In some embodiments, the reset unit $340(i)$ further resets the voltage levels of the nodes $X1(i)$, $X2(i)$ based on the reset signal RST before the display panel displays the first frame after the display panel enters a display status. For example, the reset unit $340(i)$ resets the voltage levels of the nodes $X1(i)$, $X2(i)$ based on the reset signal RST before the display panel displays the first frame after the display panel is powered on or leaves a sleep mode, but the invention is not limited thereto. The reset unit $340(i)$ includes a transistor M14 (also referred to as a reset transistor). The control terminal of the transistor M14 receives the reset signal RST, the first terminal of the transistor M14 receives the reference voltage VGL, and the second terminal of the transistor M14 is coupled to the node $X1(i)$.

Referring to FIG. 4B, in which the $(i+1)^{th}$ stage shift register $210(i+1)$ includes transistors M1'-M14'. The coupling relationships of the transistors M1'-M14' in FIG. 4B are similar to those of the transistors M1-M14 in FIG. 4A; the difference between FIG. 4A and FIG. 4B is, in FIG. 4A, the $i^{th}$ stage shift register $210(i)$ receives the clock signal CN1, the input signals IN1, IN2 and the pull-down control signal GPWL1, and the control terminal of the transistor M11 is coupled to the node $X1(i)$ to receive the precharge signal PC(i), while in FIG. 4B, the $(i+1)^{th}$ stage shift register $210(i+1)$ receives the clock signal CN2, the input signals IN3, IN4 and the pull-down control signal GPWL2, and the control terminal of the transistor M11' is coupled to the node $X1(i+1)$ to receive the precharge signal PC(i+1).

In the $(i+1)^{th}$ stage shift register $210(i+1)$ of FIG. 4B, if (i+1) is a multiple of 4, the clock signal CN2 is the clock signal C4 provided by the clock signal line L4 (as shown in FIG. 3). Oppositely, if (i+1) is not a multiple of 4, the clock signal CN2 is the clock signal C2 provided by the clock signal line L2 (as shown in FIG. 3). In the $(i+1)^{th}$ stage shift register $210(i+1)$ of FIG. 4B, the pull-down unit $330(i+1)$ is coupled to the precharge unit $310(i+1)$ and the pull-up unit $320(i+1)$, and receives the pull-down control signal GPWL2 (also referred to as a second pull-down control signal). As shown in FIG. 4A, the control terminals of the transistors M4-M7 are electrically connected, and the second terminals of the transistors M4-M7 are coupled to the nodes $X1(i)$, $X2(i)$, $X1(i+1)$, $X2(i+1)$, respectively, and thus the pull-down unit $330(i)$ may control the voltage levels of the nodes $X1(i)$, $X2(i)$, $X1(i+1)$, $X2(i+1)$ based on the pull-down control signal GPWL1, the input signal IN1 and the precharge signals PC(i), PC(i+1) received by the transistors M8-M13. Similarly, as shown in FIG. 4B, the control terminals of the transistors M4'-M7' are electrically connected, and the second terminals of the transistors M4'-M7' are coupled to the nodes $X1(i)$, $X2(i)$, $X1(i+1)$, $X2(i+1)$, respectively, and thus the pull-down unit $330(i+1)$ may control the voltage levels of the nodes $X1(i)$, $X2(i)$, $X1(i+1)$, $X2(i+1)$ based on the pull-down control signal GPWL2, the input signal IN1 and the precharge signals PC(i), PC(i+1) received by the transistors M8'-M13'. In other words, when any of the pull-down unit $330(i)$ of the $i^{th}$ stage shift register $210(i)$ and the pull-down unit $330(i+1)$ of the $(i+1)^{th}$ stage shift register $210(i+1)$ is enabled, the voltage levels of the nodes $X1(i)$, $X2(i)$ in the $i^{th}$ stage shift register $210(i)$ and the voltage levels of the nodes $X1(i+1)$, $X2(i+1)$ in the $(i+1)^{th}$ stage shift register $210(i+1)$ can be controlled at the same time.

In the $(i+1)^{th}$ stage shift register $210(i+1)$ of FIG. 4B, the reset unit $340(i+1)$ is coupled to the precharge unit $310(i+1)$ and the pull-up unit $320(i+1)$, and resets the precharge signal PC(i+1) and the scan signal SC(i+1) based on the reset signal RST after sequentially scanning all of the gate lines SL of the display panel 110 for each frame period. That is, for each frame period, after the last stage scan signal (the $N^{th}$ stage scan signal OUT(N) in this embodiment) is outputted, the voltage levels of the nodes $X1(i+1)$, $X2(i+1)$ are set to low-level. In some embodiments, the reset unit $340(i+1)$ further resets the voltage levels of the nodes $X1(i+1)$, $X2(i+1)$ based on the reset signal RST before the display panel displays the first frame after the display panel enters a display status. The control terminal of the transistor M14' (also referred to as a reset transistor) receives the reset signal RST, the first terminal of the transistor M14' receives the reference voltage VGL, and the second terminal of the transistor M14' is coupled to the node $X1(i+1)$. In the embodiments of FIG. 4A and FIG. 4B, the first terminals of the transistors M2, M4-M7, M10-M14, M2', M4'-M7', M10'-M14' receive the reference voltage VGL, but the invention is not limited thereto. In variant embodiments, the voltage levels received by the first terminals of the transistors M2, M4-M7, M10-M14, M2', M4'-M7', M10'-M14' may be partially the same or absolutely different. In other words, in the invention, the first terminals of the transistors M2, M2' receive a first voltage level (e.g. a first low voltage level), the first terminals of the transistors M4-M7, M10-M13, M4'-M7', M10'-M13' receive a second voltage level (e.g. a second low voltage level), and the first terminals of the transistors M14, M14' receive a third voltage level (e.g. a third low voltage level); at least two of the first to three voltage levels are the same, or any two of the first to three voltage levels are different.

If the shift registers $210(i)$, $210(i+1)$ are respectively the $1^{st}$ and $2^{nd}$ stage shift registers $210(1)$-$210(2)$, the input signals IN1-IN4 are the starting signal STV1, the $4^{th}$ stage scan signal OUT(4), the starting signal STV1 and the $5^{th}$ stage scan signal OUT(5), respectively. If the shift registers $210(i)$, $210(i+1)$ are respectively an odd-numbered stage shift register and an even-numbered stage shift register among the $3^{rd}$ to $(N-4)^{th}$ stage shift registers $210(3)$-$210(N-4)$, the input signals IN1-IN4 are the $(i-2)^{th}$ stage scan signal OUT(i-2), the $(i+3)^{th}$ stage scan signal OUT(i+3), the $(i-1)^{th}$ stage scan signal OUT(i-1) and the $(i+4)^{th}$ stage scan signal OUT(i+4), respectively. If the shift registers $210(i)$, $210(i+1)$ are respectively the $(N-3)^{th}$ and $(N-2)^{th}$ stage shift registers $210(N-3)$-$210(N-2)$, the input signals IN1-IN4 are the $(N-5)^{th}$ stage scan signal OUT(N-5), the $N^{th}$ stage scan signal OUT(N), the $(N-4)^{th}$ stage scan signal OUT(N-4) and the ending signal STV2, respectively. If the shift registers $210(i)$, $210(i+1)$ are respectively the $(N-1)^{th}$ and $N^{th}$ stage shift registers $210(N-1)$-$210(N)$, the input signals IN1-IN4 are the $(N-3)^{th}$ stage scan signal OUT(N-3), the ending signal STV2, the $(N-2)^{th}$ stage scan signal OUT(N-2) and the ending signal STV2, respectively.

In FIG. 4A and FIG. 4B, the transistors M1-M14, M1'-M14' may be amorphous silicon thin film transistors, low temperature polysilicon (LTPS) thin film transistors, indium gallium zinc oxide (IGZO) thin film transistors, or other suitable thin film transistors.

Figure 5:
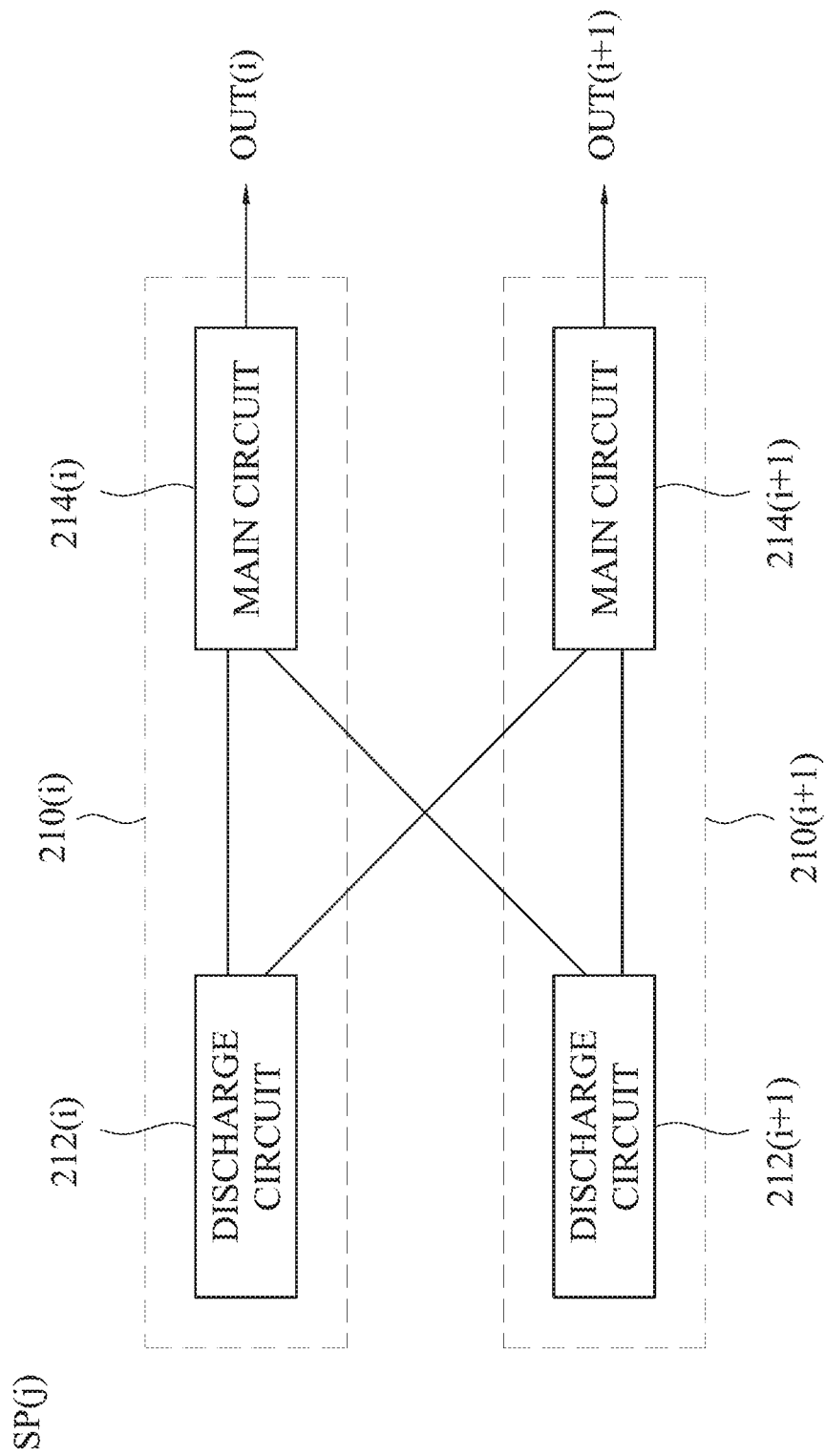
FIG. 5 is a block diagram in accordance with the circuit pair in FIG. 3.

FIG. 5 is a block diagram of the $i^{th}$ stage shift register $210(i)$ in FIG. 4A and the $(i+1)^{th}$ stage shift register $210(i+1)$ in FIG. 4B, where i is an odd number, and the $i^{th}$ and $(i+1)^{th}$ stage shift registers $210(i)$, $210(i+1)$ belong to the same circuit pair SP(j), where j is (i+1)/2. The $i^{th}$ stage shift register $210(i)$ includes a discharge circuit $212(i)$ and a main circuit $214(i)$ (also respectively referred to as an $i^{th}$ discharge circuit $212(i)$ and an $i^{th}$ main circuit $214(i)$), in which the discharge circuit $212(i)$ includes the pull-down unit $330(i)$ in FIG. 4A, while the main circuit $214(i)$ includes the precharge unit $310(i)$, the pull-up unit $320(i)$ and the reset unit $340(i)$ in FIG. 4A. The $(i+1)^{th}$ stage shift register $210(i+1)$ includes a discharge circuit $212(i+1)$ and a main circuit $214(i+1)$ (also respectively referred to as an $(i+1)^{th}$ discharge circuit $212(i+1)$ and an $(i+1)^{th}$ main circuit $214(i+1)$), in which the discharge circuit $212(i+1)$ includes the pull-down unit $330(i+1)$ in FIG. 4B, while the main circuit $214(i+1)$ includes the precharge unit $310(i+1)$, the pull-up unit 320 $(i+1)$ and the reset unit $340(i+1)$ in FIG. 4B.

Figure 4B:
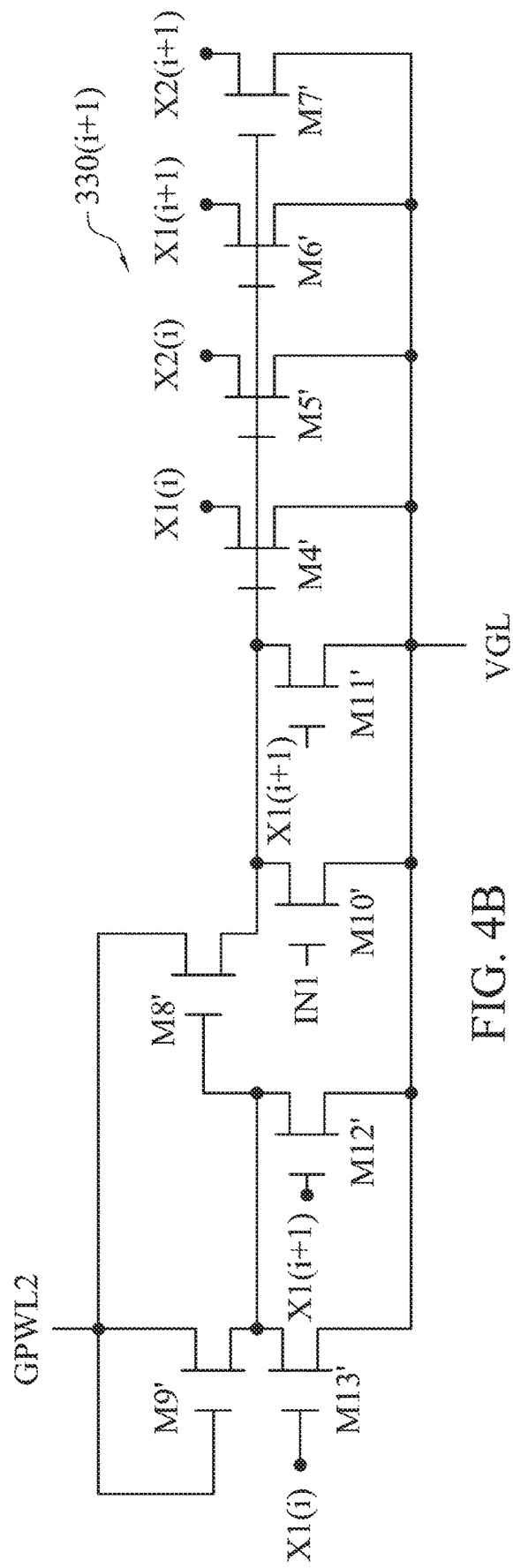

As shown in FIG. 4A and FIG. 4B, the pull-down units $330(i)$, $330(i+1)$ are all coupled to the nodes X1(i), X2(i), X1(i+1), X2(i+1) in the $i^{th}$ and $(i+1)^{th}$ stage shift registers $210(i)$, $210(i+1)$, i.e., the discharge circuits $212(i)$, $212(i+1)$ are all coupled to the nodes X1(i), X2(i), X1(i+1), X2(i+1) in the main circuits 214(1), 214(i+1) of the $i^{th}$ and $(i+1)^{th}$ stage shift registers $210(i)$, $210(i+1)$. In other words, the precharge signal PC(i) and the scan signal OUT(i) of the main circuit $214(i)$ and the precharge signal PC(i+1) and the scan signal OUT(i+1) of the main circuit $214(i+1)$ are all provided to the discharge circuits $212(i)$, $212(i+1)$, and each of the discharge circuits $212(i)$, $212(i+1)$ performs discharging on the main circuits $214(i)$, $214(i+1)$. That is, when the discharge circuit $212(i)$ is enabled, e.g. the pull-down control signal GPWL1 is at an enabling voltage level, the voltage levels of the nodes X1(i), X2(i), X1(i+1), X2(i+1) in the main circuits 214(1), 214(i+1) of the $i^{th}$ and $(i+1)^{th}$ stage shift registers $210(i)$, $210(i+1)$ may be controlled at the same time, so as to stabilize the outputted scan signals OUT(i), OUT(i+1) at a predetermined voltage level, and when the discharge circuit $212(i+1)$ is enabled, e.g. the pull-down control signal GPWL2 is at an enabling voltage level, the voltage levels of the nodes X1(i), X2(i), X1(i+1), X2(i+1) in the main circuits 214(1), 214(i+1) of the $i^{th}$ and $(i+1)^{th}$ stage shift registers $210(i)$, $210(i+1)$ may also be controlled at the same time, so as to stabilize the outputted scan signals OUT(i), OUT(i+1) at the predetermined voltage level, thus achieving signal voltage level stability. In comparison with the conventional art in which each stage shift register includes two pull-down control circuits respectively coupled to different pull-down control signals and discharging a main circuit of only one stage shift register, embodiments of the invention (e.g. the embodiment of the $i^{th}$ and $(i+1)^{th}$ stage shift registers $210(i)$, $210(i+1)$ shown in FIG. 4A to FIG. 5) may greatly reduce the layout area of the gate driving circuit 200, which is beneficial to achieve a narrow border requirement, and may ensure the reliability of the gate driving circuit 200.

Figure 6A:
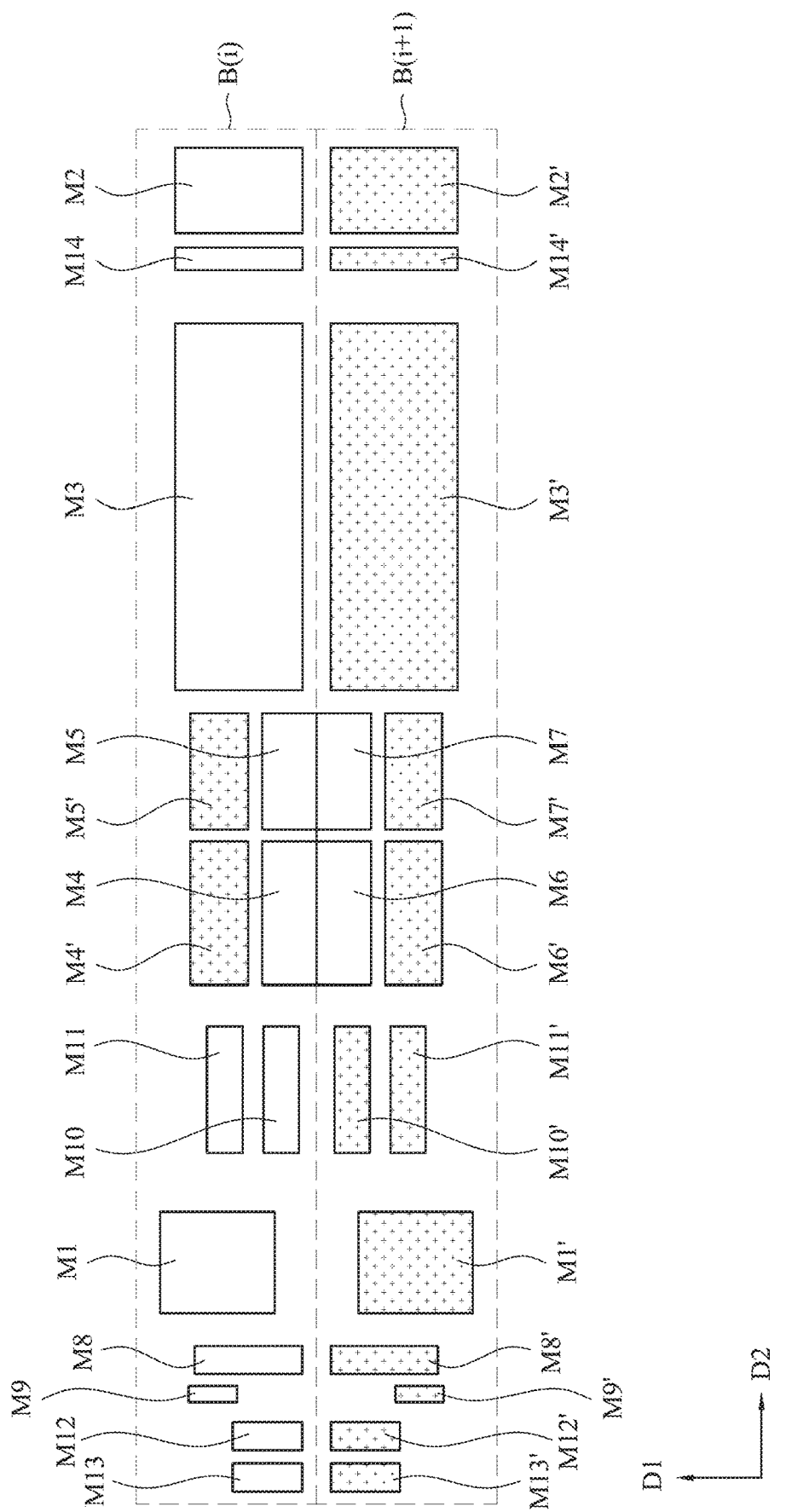
FIG. 6A is an exemplary transistor block layout diagram in accordance with the circuit pair in FIG. 3.
Figure 6B:
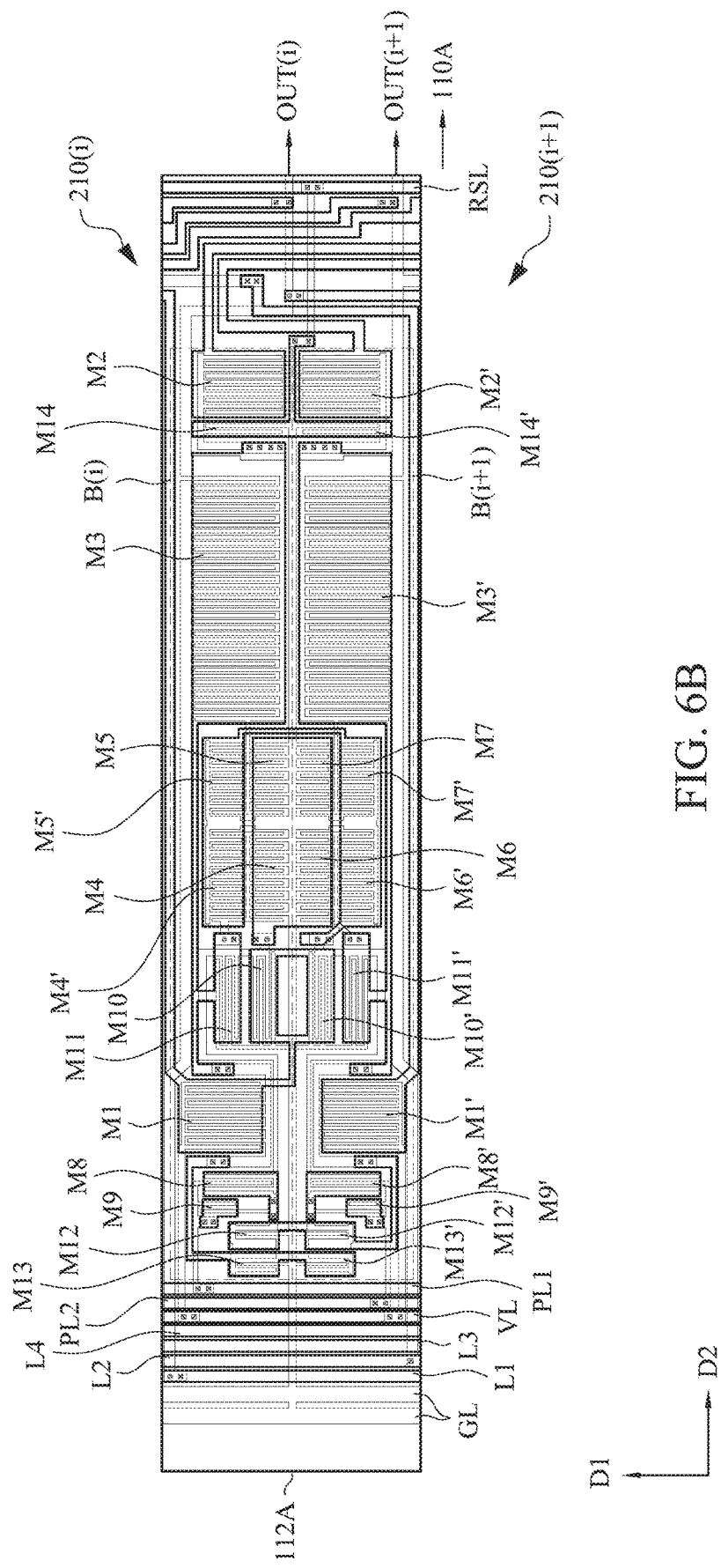
FIG. 6B is an exemplary component layout diagram in accordance with the circuit pair in FIG. 3.

Referring to FIG. 6A and FIG. 6B, FIG. 6A is a transistor block layout diagram of the $i^{th}$ stage shift register $210(i)$ in FIG. 4A and the $(i+1)^{th}$ stage shift register $210(i+1)$ in FIG. 4B, and FIG. 6B is a component layout diagram of the $i^{th}$ stage shift register $210(i)$ in FIG. 4A and the $(i+1)^{th}$ stage shift register $210(i+1)$ in FIG. 4B, i.e., FIG. 6A and FIG. 6B are respectively a transistor block layout diagram and a component layout diagram of the circuit pair SP(i). In FIG. 6B, the component symbol 110A and the arrow represent the display area 110A is at the right side of the component layout diagram of the circuit pair, i.e. the scan signals OUT(i)-OUT(i+1) are outputted toward right to the corresponding gate lines SL (not shown in FIG. 6B) in the display area 110A, and the component layout diagram of the circuit pair is located between the left side 112A of the first substrate 112 and the display area 110A. In other words, the transistor block layout diagram and the component layout diagram of the circuit pair SP(i) in FIG. 6A and FIG. 6B are disposed between the left side of the display area 110A and the left side 112A of the first substrate 112. In variant embodiments where the circuit pair SP(j) is between the right side of the display area 110A and right side of the first substrate 112, the transistor block layout diagram and the component layout diagram of the circuit pair SP(i) in FIG. 6A and FIG. 6B may be rotated by 180 degrees about the first direction D1 as a rotation axis, so as to obtain the transistor block layout diagram and the component layout diagram of the circuit pair SP(i) corresponding to the variant embodiment, in which the scan signal OUT(i), OUT(i+1) are outputted toward left to the corresponding gate lines SL in the display area 110A. As shown in FIG. 6B, the first reference voltage level line VL (which provides the reference voltage level VGH), the second reference voltage level line GL (which provides the reference voltage level VGL), the clock signal lines L1-L4 and the pull-down control signal lines PL1, PL2 are at an area near to the left side 112A of the first substrate 112 and extend and along the first direction D1, the signal lines for outputting the scan signals OUT(i), OUT(i+1) and those of the other stage shift registers and the reset signal line RSL are at an area near the display area 110A, and the transistors M1-M14, M1'-M14' in each of the $i^{th}$ and $(i+1)^{th}$ stage shift registers $210(i)$, $210(i+1)$ are disposed between the two areas. In the $i^{th}$ and $(i+1)^{th}$ stage shift registers 210(i), 210(i+1), the reset transistors M14, M14' are respectively disposed between the transistors M2, M3 and between the transistors M2', M3'.

In addition, the layout diagrams of FIG. 6A and FIG. 6B include upper and lower blocks B(i), B(i+1) neighboring each other. In this embodiment, the blocks B(i), B(i+1) have the same rectangular shape, but the invention is not limited thereto. As shown in FIG. 6A and FIG. 6B, the transistors M6, M7 in the pull-down unit 330(i) of the $i^{th}$ stage shift register 210(i) are disposed in the block B(i+1), while the other transistors in the $i^{th}$ stage shift register 210(i), including the transistors M1, M2 in the precharge unit 310(i), the transistor M3 in the pull-up unit 320(i), the transistors M4-M5, M8-M13 in the pull-down unit 330(i) and the transistor M14 in the reset unit 340(i) are disposed in the block B(i); the transistors M4', M5' in the pull-down unit 330(i+1) of the $(i+1)^{th}$ stage shift register 210(i+1) are disposed in the block B(i), while the other transistors in the $(i+1)^{th}$ stage shift register 210(i+1), including the transistors M1', M2' in the precharge unit 310(i+1), the transistor M3' in the pull-up unit 320(i+1), the transistors M6'-M13' in the pull-down unit 330(i+1) and the transistor M14' in the reset unit 340(i+1) are disposed in the block B(i+1). That is, the precharge unit 310(i), the pull-up unit 320(i) and the reset unit 340(i) of the $i^{th}$ stage shift register 210(i) are disposed in the block B(i), the precharge unit 310(i+1), the pull-up unit 320(i+1) and the reset unit 340(i+1) of the $(i+1)^{th}$ stage shift register 210(i+1) are disposed in the block B(i+1), and the pull-down units 330(i), 330(i+1) of the $i^{th}$ and $(i+1)^{th}$ stage shift registers 210(i), 210(i+1) are simultaneously disposed in the blocks B(i), B(i+1).

Figure 7A:
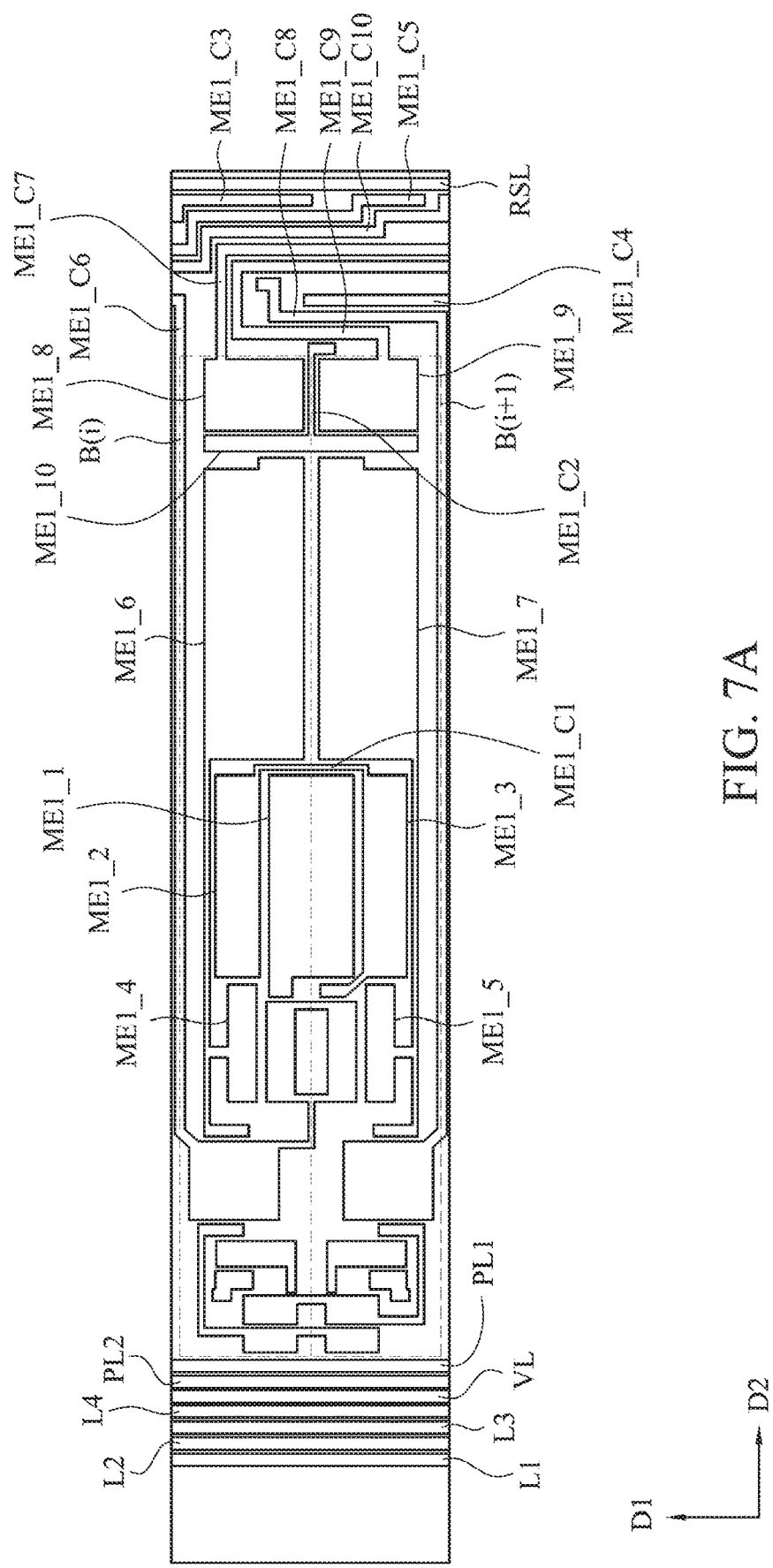
FIG. 7A is a layout diagram corresponding to the first metal layer in FIG. 6B.
Figure 7B:
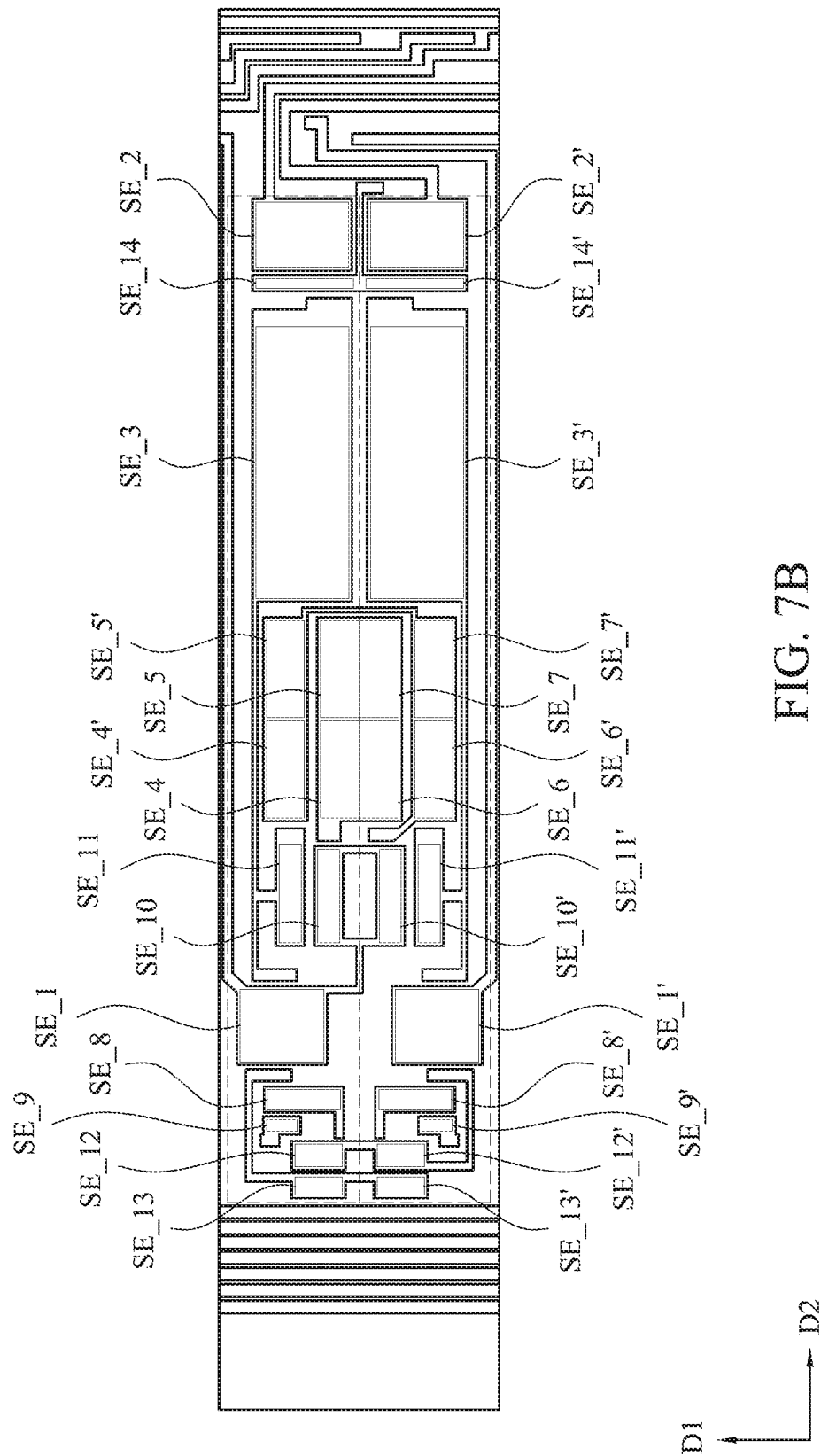
FIG. 7B is a layout diagram corresponding to the first metal layer and the semiconductor layer in FIG. 6B.
Figure 7C:
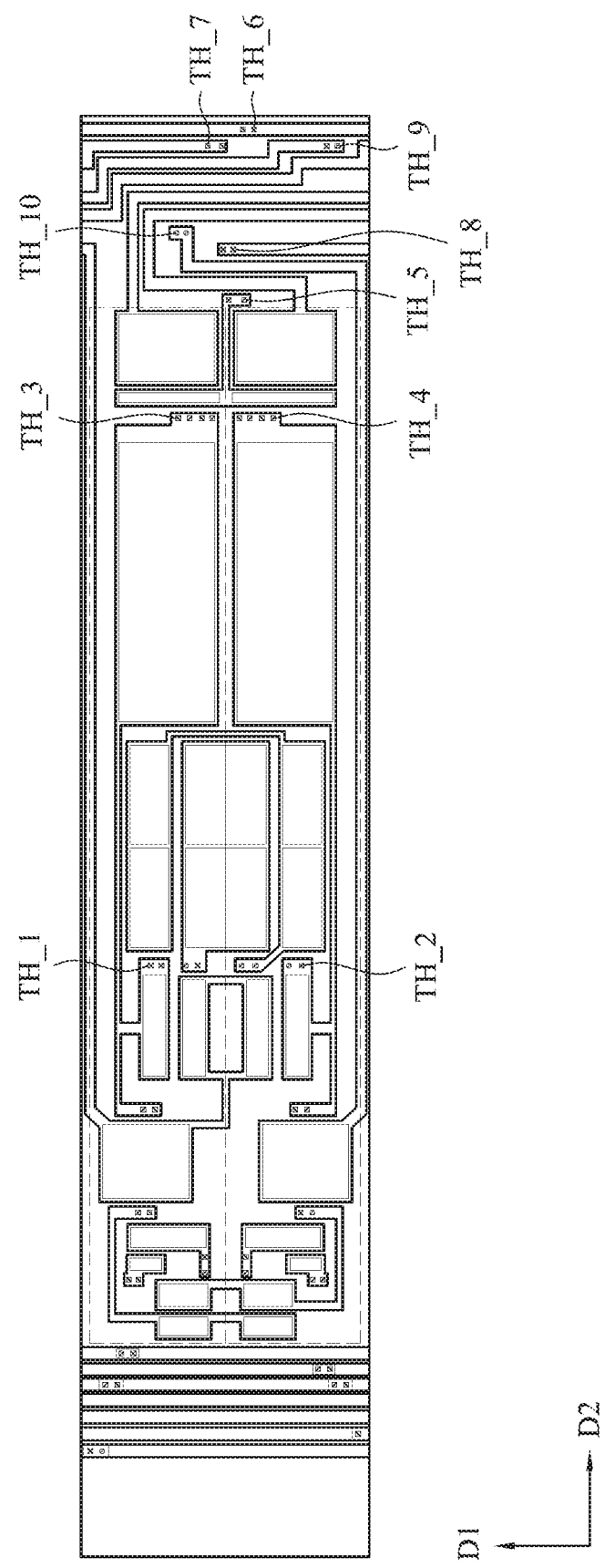
FIG. 7C is a layout diagram corresponding to the first metal layer, the semiconductor layer and the through holes in FIG. 6B.
Figure 7D:
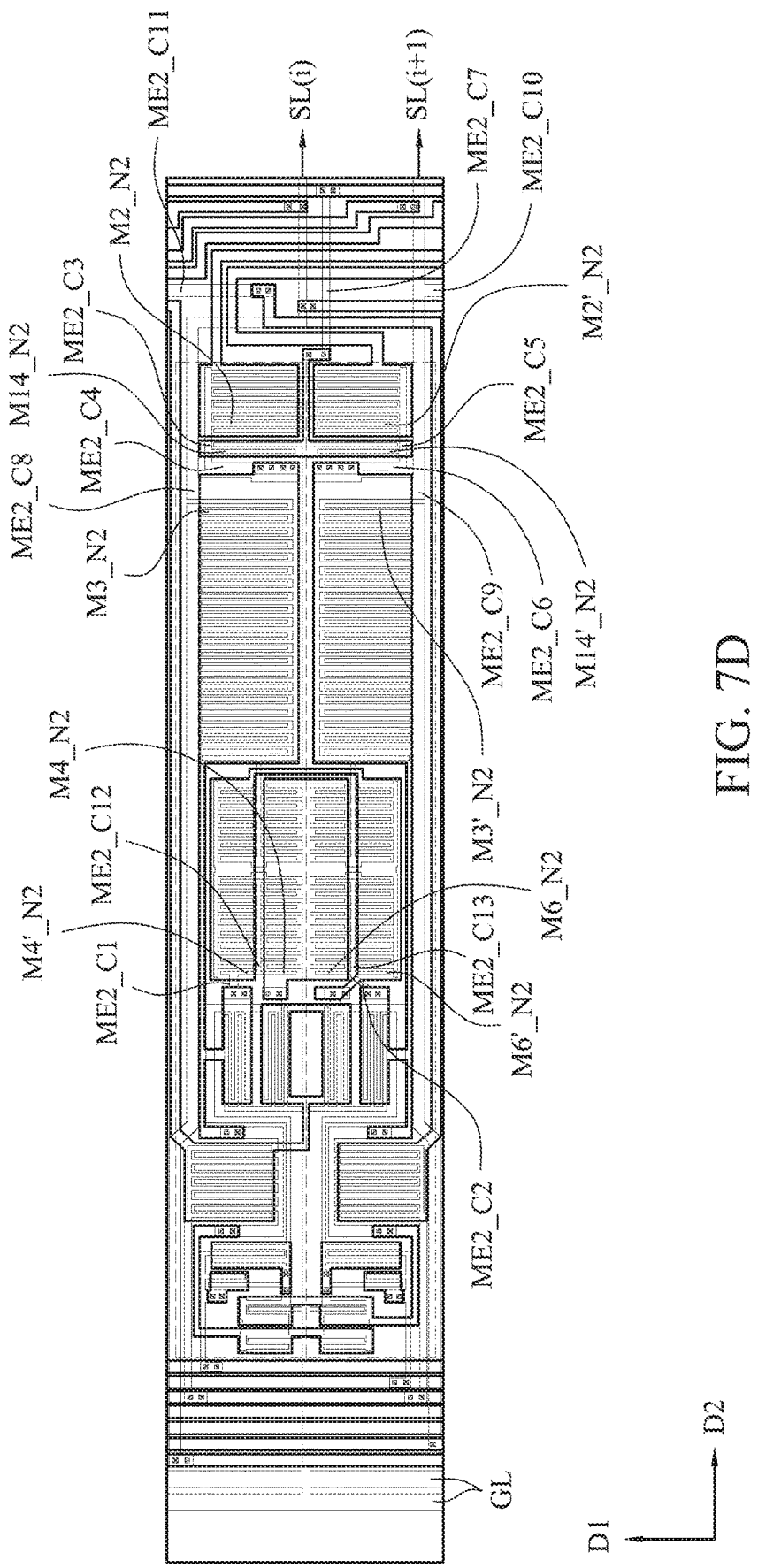
FIG. 7D is a layout diagram corresponding to the first metal layer, the semiconductor layer, the through hole and the second metal layer in FIG. 6B.

Referring to FIG. 4A, FIG. 4B, FIG. 6B and FIG. 7A to FIG. 7D, FIG. 7A is a layout diagram corresponding to the first metal layer in FIG. 6B, FIG. 7B is a layout diagram corresponding to the first metal layer and the semiconductor layer in FIG. 6B, FIG. 7C is a layout diagram corresponding to the first metal layer, the semiconductor layer and the through holes in FIG. 6B, and FIG. 7D is a layout diagram in which the second metal layer stacked on the layout diagram of FIG. 7C. The layout diagram of the first metal layer, the semiconductor layer, the through holes and the second metal layer in FIG. 7D is the same as that in FIG. 6B. As shown in FIG. 7A to FIG. 7D, the first metal layer ME1 includes plural metal blocks (e.g. ME1_1-ME1_10), plural conductive wirings (e.g. ME1_C1-ME1_C10), the reset signal line RSL, the first reference voltage level line VL, the clock signal lines L1-L4 and the pull-down control signal lines PL1, PL2, the semiconductor layer SE includes plural semiconductor blocks (e.g. SE_1-SE_14, SE_1'-SE_14'), a second metal layer ME2 includes the first terminals and the second terminals (the sources and the drains, or the drains and the sources) of plural transistors (e.g. second terminals M3_N2, M14_N2, M3'_N2, M14'_N2 of the transistors M3, M14, M3', M14'), plural conductive wirings (e.g. ME2_C1-ME2_C13) and the second reference voltage level line GL, and the through holes (e.g. TH_1-TH_10) are formed in the insulating layer (now shown) between the first metal layer ME1 and the second metal layer ME2. The through holes are disposed corresponding to the first metal layer ME1 and the second metal layer ME2, so as to electrically connect the first metal layer ME1 and the second metal layer ME2. For example, the through hole TH_1 is disposed corresponding to the metal block ME1_4 and the conductive wiring ME2_C1, so as to electrically connect the metal block ME1_4 and the conductive wiring ME2_C1; the through hole TH_10 is disposed corresponding to the conductive wirings ME1_C8, ME2_C11, so as to electrically connect the conductive wirings ME1_C8, ME2_C11. In FIG. 7B, the semiconductor blocks SE_1-SE_14, SE_1'-SE_14' are semiconductor layers respectively corresponding to the transistors M1-M14, M1'-M14'. As shown in FIG. 4A, FIG. 4B, FIG. 6B and FIG. 7A to FIG. 7D, the gates of the transistors M4-M7 in the $i^{th}$ stage shift registers 210(i) are electrically connected with each other, the gates of the transistors M4'-M7' in the $(i+1)^{th}$ stage shift registers 210(i+1) are electrically connected with each other, the second terminals of the transistors M4, M4' in the $i^{th}$ and $(i+1)^{th}$ stage shift registers 210(i), 210(i+1) and the gate of the transistor M11 in the $i^{th}$ stage shift register 210(i) are all coupled to the node X1(i) of the $i^{th}$ stage shift register 210(i), and the second terminals of the transistors M6 and M6' in the $i^{th}$ and $(i+1)^{th}$ stage shift registers 210(i), 210(i+1) and the gate of the transistor M11' in the $(i+1)^{th}$ stage shift register 210(i+1) are all coupled to the node X1(i+1) in the $(i+1)^{th}$ stage shift register 210(i+1), thus the gates of the transistors M4-M7 in the $i^{th}$ stage shift register 210(i) all belong to the metal block ME1_1 disposed simultaneously in the blocks B(i), B(i+1), and the semiconductor block SE_4, SE_5, SE_6, SE_7 corresponding to the transistors M4, M5, M6, M7 are all disposed on the metal block ME1_1; all of the gates of the transistor M4', M5' in the $(i+1)^{th}$ stage shift register 210(i+1) belong to the metal block ME1_2 disposed in the block B(i), and the semiconductor blocks SE_4', SE_5' corresponding to the transistor M4', M5' are all disposed on the metal block ME1_2, while all of the gates of the transistor M6', M7' belong to another metal block ME1_3 disposed in the block B(i+1), the semiconductor block SE_6', SE_7' corresponding to the transistor M6', M7' are all disposed on the metal block ME1_3, and the metal blocks ME1_2, ME1_3 are electrically connected with other through the conductive wiring ME1_C1 formed from the first metal layer ME1. The transistors M11, M11' in the $i^{th}$ and $(i+1)^{th}$ stage shift registers 210(i), 210(i+1) are respectively disposed in the blocks B(i), B(i+1), and therefore, by the abovementioned layout arrangement, the transistors M4, M11 in the $i^{th}$ stage shift register 210(i) and the transistor M4' in the $(i+1)^{th}$ stage shift register 210(i+1) are all disposed in the block B(i), the transistors M4, M4' neighbor each other along the first direction D1, and the transistors M11, M4' neighbor each other along the second direction D2, while the transistors M6', M11' in the $(i+1)^{th}$ stage shift register 210(i+1) and the transistor M6 in the $i^{th}$ stage shift register 210(i) are all disposed in the block B(i+1), the transistors M6, M6' neighbor each other along the first direction D1, and the transistors M11', M6 are obliquely opposite to each other. Therefore, the second terminal M4' N2 of the transistor M4' and the second terminal M4 N2 of the transistor M4 may extend in the first direction D1 and be electrically connected to each other through the conductive wiring ME2_C12 extending in the second direction D2, and the second terminal M4' N2 of the transistor M4' in the $(i+1)^{th}$ stage shift register 210(i+1) may be electrically connected to the metal block ME1_4 through the conductive wiring ME2_C1 formed from the second metal layer ME2 and the through hole TH_1, such that the second terminals of the transistors M4, M4' are electrically connected to the gate of the transistor M11 in the $i^{th}$ stage shift register 210(i), i.e., the second terminals of the transistors M4, M4' in the $i^{th}$ and the $(i+1)^{th}$ stage shift registers 210(i), 210(i+1) and the gate of the transistor M11 in the $i^{th}$ stage shift register 210(i) are coupled to each other, so as to further electrically connect the node X1(i) in the $i^{th}$ stage shift register 210(i). The second terminal M6 N2 of the transistor M6 and the second terminal M6' N2 of the transistor M6' may extend in the first direction D1 and be electrically connected with each other through the conductive wiring ME2_C13 extending in the second direction D2, and the second terminal of the transistor M6 in the $i^{th}$ stage shift register 210($i$) may be electrically connected to the metal block ME1_5 through another conductive wiring ME2_C2 formed from the second metal layer ME2 and the through hole TH_2, such that the second terminal of the transistor M6 is electrically connected to the gate of the transistor M11' in the (i+1)$^{th}$ stage shift register 210($i$+1), i.e., the second terminals of the transistors M6, M6' in the $i^{th}$ and (i+1)$^{th}$ stage shift registers 210($i$), 210($i$+1) and the gate of the transistor M11' in the (i+1)$^{th}$ stage shift register 210($i$+1) are coupled to each other, so as to further electrically connect to the node X1($i$+1) in the (i+1)$^{th}$ stage shift register 210($i$+1). Compared with the layout arrangement of disposing the transistors in the $i^{th}$ and (i+1)$^{th}$ stage shift registers 210($i$), 210($i$+1) respectively in the blocks B($i$), B($i$+1), in which the conductive wiring electrically connected to the second terminal of the transistor M4' and the gate of the transistor M11 and the conductive wiring electrically connected to the second terminal of the transistor M6 and the gate of the transistor M11' have to transfer between different metal layers multiple times for crossing other conductive wirings because the distance between the second terminal of the transistor M4' and the gate of the transistor M11 and the distance between the second terminal of the transistor M6 and the gate of the transistor M11' is long, the layout arrangement of this invention disposes the transistors M4, M5 in the $i^{th}$ stage shift register 210($i$) and the transistors M4', M5' in the (i+1)$^{th}$ stage shift register 210($i$+1) simultaneously in the block B($i$) and disposes the transistors M6, M7 in the $i^{th}$ stage shift register 210($i$) and the transistors M6', M7' in the (i+1)$^{th}$ stage shift register 210($i$+1) simultaneously in the block B($i$+1), such that the second terminal of the transistor M4' and the gate of the transistor M11 are electrically connected only through the conductive wiring ME2_C1 formed from the second metal layer ME2 and the through hole TH_1, and the second terminal of the transistor M6 and the gate of the transistor M11' are electrically connected only through the conductive wiring ME2_C2 formed from the second metal layer ME2 and the through hole TH_2, and thus no conductive wirings for transferring between different metal layers multiple times are needed, thereby saving the layout area.

Moreover, the metal blocks ME1_6, ME1_7 respectively include the gates of the transistors M3, M3', the metal blocks ME1_8, ME1_9 respectively include the gates of the transistors M2, M2', and the metal block ME1_10 includes the gates of the transistors M14, M14'. The semiconductor blocks SE_2, SE_2', SE_3, SE_3' are respectively disposed on the metal blocks ME1_8, ME1_9, ME1_6, ME1_7, and the semiconductor block SE_14, SE_14' are all disposed on the metal block ME1_10. In the $i^{th}$ and (i+1)$^{th}$ stage registers 210($i$), 210($i$+1), the second terminal of the transistor M14 is electrically connected to the gate of the transistor M3 and the second terminal of the transistor M2, the second terminal of the transistor M14' is electrically connected to the gate of the transistor M3' and the second terminal of the transistor M2', and all of the gates of the transistors M14, M14' receive the reset signal RST; thus, the second terminal M14_N2 of the transistor M14 is electrically connected to the second terminal M2_N2 of the transistor M2 through the conductive wiring ME2_C3 that extends along the second direction D2, as well as being electrically connected to the gate of the transistor M3 (i.e. electrically connected to the metal block ME1_6) through the conductive wiring ME2_C3 that extends along the second direction D2, the conductive wiring ME2_C4 that extends along the first direction D1 and the through hole TH_3, and the second terminal M14'_N2 of the transistor M14' is electrically connected to the second terminal M2'_N2 of the transistor M2' through the conductive wiring ME2_C5 that extends along the second direction D2, as well as being electrically connected to the gate of the transistor M3' (i.e. electrically connected to the metal block ME1_7) through the conductive wiring ME2_C5 that extends along the second direction D2, the conductive wiring ME2_C6 along the first direction D1, and the through hole TH_4. The gates of the transistors M14, M14' belong to the metal block ME_10 that is disposed between the metal blocks ME1_6-ME1_7, the metal block ME1_8-ME1_9 and the metal block ME_10 is electrically connected to the reset signal line RSL through the conductive wiring ME1_C2 that is formed from the first metal layer ME1, the through hole TH_5, the conductive wiring ME2_C7 formed form the second metal layer ME2 and the through hole TH_6. In this embodiment, the scan signal OUT($i$) of the $i^{th}$ stage shift register 210($i$) is transmitted to corresponding gate line SL($i$) in the display area 110A through the conductive wiring ME2_C8 by the second terminal M3_N2 of the transistor M3, and the scan signal OUT(i+1) of the (i+1)$^{th}$ stage shift register 210($i$+1) is transmitted to the corresponding gate line SL(i+1) in the display area 110A through the conductive wiring ME2_C9 by the second terminal M3' N2 of the transistor M3'. In addition, the scan signal OUT($i$) of the $i^{th}$ stage shift register 210($i$) has to transmitted to the (i−3)$^{th}$ stage shift register 210($i$−3) and/or the (i+2)$^{th}$ stage shift register 210($i$+2), and the scan signal OUT(i+1) of the (i+1)$^{th}$ stage shift register 210($i$+1) has to be transmitted to the (i−2)$^{th}$ stage shift register 210($i$−2) and/or the (i+1)$^{th}$ stage shift register 210 ($i$+3); therefore, the conductive wiring ME2_C8 may transmit the scan signal OUT($i$) to the (i−3)$^{th}$ stage shift register 210($i$−3) through the through hole TH_7 and the conductive wiring ME1_C3 and to the (i+2)$^{th}$ stage shift register 210 ($i$+2) through the through hole TH_8 and the conductive wiring ME1_C4, and the conductive wiring ME2_C9 may transmit the scan signal OUT(i+1) to the (i−2)$^{th}$ stage shift register 210($i$−2) through the through hole TH_9 and the conductive wiring ME1_C5 that extends along the first direction D1 and to the (i+3)$^{th}$ stage shift register 210($i$+3) through the conductive wiring ME2_C10 that extends along the first direction D1. Moreover, as shown in FIG. 7A, FIG. 7C and FIG. 7D, the layout diagrams of the $i^{th}$ and (i+1)$^{th}$ stage shift registers 210($i$), 210($i$+1) further include the conductive wirings ME1_C6-ME1_C10, ME2_C11 and the through hole TH10, the (i−2)$^{th}$ stage scan signal OUT(i−2) and the (i+3)$^{th}$ stage scan signal OUT(i+3) are inputted to the $i^{th}$ stage shift register 210($i$) respectively by the conductive wirings ME1_C6, ME1_C7 to be the input signals IN1, IN2, the (i−1)$^{th}$ scan signal OUT(i−1) is inputted to the (i+1)$^{th}$ stage shift register 210($i$+1) by the conductive wiring ME2_C11, the through hole TH_10 and the conductive wiring ME1_C8 to be the input signal IN3, the (i+4)$^{th}$ scan signal OUT(i+4) is inputted to the (i+1)$^{th}$ stage shift register 210($i$+1) by the conductive wiring ME1_C9 to be the input signal IN4, and the stage following to the (i+1)$^{th}$ stage shift register 210($i$+1) is inputted to the stage previous to the $i^{th}$ stage shift register 210($i$) by the conductive wiring ME1_C10 to be the input signal IN4. Because the second terminals of the transistors M3, M3' respectively output the scan signals OUT($i$), OUT(i+1) to the corresponding gate lines SL($i$), SL(i+1) in the display area 110A, and in order to prevent the conductive wirings electrically connected between the metal block ME1_10 and the reset signal line RSL from having to transfer between different metal layers multiple times for crossing other conductive wirings, the reset signal line RSL is preferably disposed between the transistors M1-M14, M1'-M14' and the display area 110A instead of between the transistors M1-M14, M1'-M14' and the left side 112A of the first substrate 112, so as to shorten the distance between the transistors M14, M14' and the reset signal line RSL, thus optimizing the layout of the circuit pair SP(j). In this embodiment, the reset signal line RSL is disposed between the transistors M2, M2' and the display area 110A, and is preferably between the conductive wiring for transmitting the input signals IN1-IN4 (i.e, transmitting the scan signal to some prior stages and some next stages of the shirt register) and the display area 110A, but the invention is not limited thereto. In variant embodiments, the reset signal line RSL may be disposed between the transistors M2, M2' and the conductive wirings for transmitting the input signals IN1-IN4. To sum up, in the layout diagrams of the i$^{th}$ and (i+1)$^{th}$ stage shift registers 210(i), 210(i+1), the reset transistor M14 is disposed between the transistors M3, M2, the reset transistor M14' is disposed between the transistors M3', M2', the reset signal line RSL is disposed between the transistors M2, M2' and the display area 110A, and is preferably between the conductive wirings for transmitting the input signals IN1-IN4 and the display area 110A. In this embodiment, all of the gates of the transistors M14, M14', the reset signal line RSL and the conductive wirings ME1_C3, ME1_C5, ME1_C8-ME1_C10 between the transistors M2, M2' and the reset signal line RSL belong to the first metal layer ME1, the conductive wiring ME2_C7 formed from the second metal layer ME2 is disposed between the reset signal line RSL and the control terminals (i.e. gates) of the reset transistors M14, M14' and is electrically connected to the reset signal line RSL through the through hole TH6 and the control terminals of the reset transistors M14, M14' through the conductive wiring ME1_C2, so as to cross the signal lines between the transistors M2, M2' and the reset signal line RSL. In other words, the reset signal RST is transmitted to the reset transistors M14, M14' through transfer of layers by the reset signal line RSL; that is, the reset signal line RSL is electrically connected to the reset transistors M14, M14' through conductive wirings of different metal layers and through hole electrically connecting different metal layers. In addition, in the embodiments of FIG. 6B through FIG. 7D, the through holes TH_1-TH_10 are formed in the insulating layer between the first metal layer ME1 and the second metal layer ME2, and is disposed corresponding to the first metal layer ME1 and the second metal layer ME2, so as to electrically connect the first metal layer ME1 and the second metal layer ME2. In other words, each of the through holes TH_1-TH_10 exposes a portion of the first metal layer ME1, and a portion of the second metal layer ME2 extends into the through holes TH_1-TH_10 to contact the first metal layer ME1, so as to form a connecting structure for electrically connecting the first metal layer ME1 and the second metal layer ME2. However, the invention is not limited to the connecting structure for electrically connecting different metal layers. In another embodiment, two through holes are formed in at least one insulating layer covering the first metal layer ME1 and the second metal layer ME2 and respectively expose a portion of the first metal layer ME1 and a portion of the second metal layer ME2, and subsequently a conductive layer (e.g., a transparent conductive but not limited thereto) is further formed, which includes a bridge electrode extending into the two through holes to contact the first metal layer ME1 and the second metal layer ME2, such that the first metal layer ME1 and the second metal layer ME2 are electrically connected with each other through the bridge electrode.

FIG. 6A and FIG. 6B only illustrate the arrangement of the transistor blocks and the components in the circuit pair SP(j); the other circuit pairs may also have similar arrangements. In addition, the two shift registers of each of the circuit pairs SP(1)-SP(M) are disposed neighboring each other along the first direction D1, and any adjacent two of the circuit pairs SP(1)-SP(M) are also disposed neighboring each other along the first direction D1. That is, the 1$^{st}$ stage to N$^{th}$ stage shift registers 210(1)-210(N) are sequentially disposed along the first direction D1. In this embodiment, the first direction D1 is perpendicular to the second direction D2, but the invention is not limited thereto. In another embodiment, the first direction D1 and the second direction D2 are different, and the angle therebetween is not 90 degrees. In this embodiment, the two neighboring shift registers in one of the circuit pairs SP(1)-SP(M) are aligned in the first direction D1, and the circuit pairs SP(1)-SP(M) are aligned in the first direction D1 or adjacent two of the circuit pairs SP(1)-SP(M) are misaligned in the first direction D1. In other words, the connection line connecting the center points of the two neighboring shift registers in one of the circuit pairs SP(1)-SP(M) is parallel to the first direction D1, and the connection line connecting the center points of the two neighboring circuit pairs is parallel to the first direction D1, or else the angle between the connection line connecting the center points of the two neighboring circuit pairs and the first direction D1 is nonzero, but the invention is not limited thereto. In one variant embodiment, the angle between the connection line connecting the center points of the two neighboring shift registers in one of the circuit pairs SP(1)-SP(M) and the first direction D1 is nonzero, and the angle between the connection line connecting the center points of the two neighboring circuit pairs and the first direction D1 is nonzero. For example, in the embodiment in which the display area 110A is rectangular, the connection line connecting the center points of the two neighboring shift registers and the connection line connecting the center points of the two neighboring circuit pairs may be parallel to the first direction D1, but is not limited thereto. In the embodiment in which the display area 110A is non-rectangular, e.g., the edge of the display area 110A has arcs or diagonal line segments, the angle between the connection line connecting the center points of the two neighboring shift registers and the first direction D1 and/or the angle between the connection line connecting the center points of the two neighboring circuit pairs and the first direction D1 is nonzero, but is not limited thereto.

It is noted that, the layout diagrams shown in FIG. 6A and FIG. 6B are merely illustrative examples, but are not intended to limit the scope of the invention. Those ordinary skill in the art may correspondingly adjust the arrangement of the electrical components in the i$^{th}$ and (i+1)$^{th}$ stage shift register 210(i), 210(i+1) according to the circuit diagrams shown in FIG. 4A and FIG. 4B or other design requirements. For example, the ground line GL and the power supply line VL may be adjust to be disposed near the area near the display area 110A.

Figure 8:
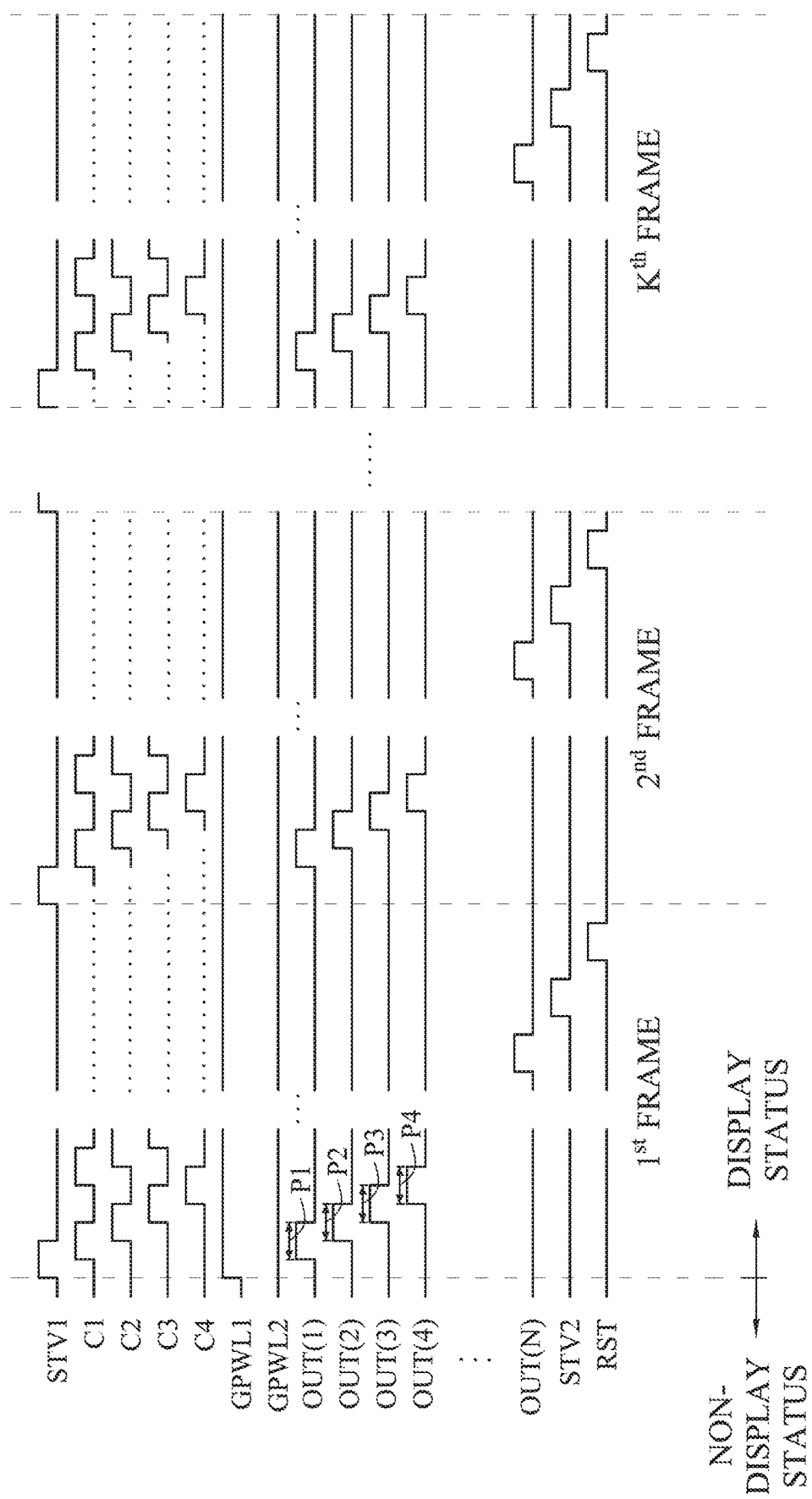
FIG. 8 is an exemplary time sequence diagram in accordance with the gate driving circuit in FIG. 3.

FIG. 8 is an exemplary time sequential diagram in accordance with the gate driving circuit 200 in FIG. 3. As shown in FIG. 8, after the display panel switches form the non-display status to the display status (e.g., the display panel enters the display status after powered on or enters the display status after leaving the sleep mode to the restart mode), the gate driving circuit 200 starts outputting the 1$^{st}$ to $N^{th}$ stage scan signals OUT(1)-OUT(N). During the $1^{st}$ frame period, the starting signal STV1 and the pull-down control signal GPWL1 rise from a low voltage level to a high voltage level, and then the clock signals C1-C4 sequentially rise to the high voltage level, such that the $1^{st}$ to $4^{th}$ stage scan signals OUT(1)-OUT(4) correspondingly rise to the high voltage level; the clock signals C1-C4 sequentially falls to the low voltage level, such that the $1^{st}$ to $4^{th}$ stage scan signals OUT(1)-OUT(4) correspondingly fall to the low voltage level. As shown in FIG. 8, the $1^{st}$ to $4^{th}$ stage scan signals OUT(1)-OUT(4) are at the high voltage level respectively in the time periods P1-P4 (i.e. in an enabling status respectively in the time periods P1-P4), so as to turn on the thin film transistors TFT in the corresponding rows of pixels PX. The high-low voltage level transition period of the clock signals C1-C4 is defined as a clock period. For example, when the clock period of the clock signals C1-C4 is T, the time durations of the high voltage level and the low voltage level in one clock period T are both T/2, and the clock signals C2, C3, C4 respectively lag the clock signals C1, C2, C3 by ¼ clock period (i.e. T/4). The $5^{th}$ to $N^{th}$ stage scan signals OUT(5)-OUT(N) sequentially rise to the high voltage level and sequentially fall to the low voltage level in a same manner based on the abovementioned description, so as to respectively drive the corresponding pixels in the display panel. After the $1^{st}$ to $N^{th}$ scan signals OUT(1)-OUT(N) sequentially rise to the high voltage level and sequentially fall to the low voltage level, the ending signal STV2 rises from the low voltage level to the high voltage level and then falls from the high voltage level to the low voltage level, so as to complete data inputting in the $1^{st}$ frame period. Before the starting signal STV1 rises from the low voltage level to the high voltage level in the $2^{nd}$ frame period, the reset signal RST rises from the low voltage level to the high voltage level, i.e., the reset signal RST rises from the disabling voltage level to the enabling voltage level, so as to turn on the transistors M14 in the reset units 340(1)-340(N) of the shift registers 210(1)-210(N) and thus reset the voltage levels of the nodes X1(1)-X1(N), X2(1)-X2(N) to the low voltage level (e.g. the reference voltage level VGL). After the voltage level reset operations on the nodes X1(1)-X1(N), X2(1)-X2(N), the reset signal RST falls from the high voltage level to the low voltage level, i.e., the reset signal RST falls from the enabling voltage level to the disabling voltage level, so as to turn off the transistor M14 in the reset units 340(1)-340(N) of the shift registers 210(1)-210(N). In other words, after the gate driving circuit scans the gate lines sequentially in the $1^{st}$ frame period and before gate driving circuit scans the gate lines in the $2^{nd}$ frame period, the transistors M14 in the reset units 340(1)-340(N) of the shift registers 210(1)-210(N) are turned on by the voltage level switch of the reset signal RST (e.g. rising from the low voltage level to the high-voltage level), and then the voltage levels of the nodes X1(1)-X1(N), X2(1)-X2(N) of the shift registers 210(1)-210(N) are set to be the predetermined disabling voltage level, so as to avoid affecting image display. The voltage level of the reset signal RST also switches (e.g. rising from the low voltage level to the high voltage level) after the gate driving circuit 200 scans the gate lines SL sequentially in the $2^{nd}$ frame period and before gate driving circuit 200 scans the gate lines SL in the $3^{rd}$ frame period, . . . , and after the gate driving circuit 200 scans the gate lines SL sequentially in the $(K-1)^{th}$ frame period and before gate driving circuit 200 scans the gate lines SL in the $K^{th}$ frame period. In other words, the reset units 340(1)-340(N) of the shift registers 210(1)-210(N) reset the voltage levels of the nodes X1(1)-X1(N), X2(1)-X2(N) of the shift registers 210(1)-210(N) after the gate driving circuit 200 generates the $1^{st}$ to $N^{th}$ stage scan signals in the $n^{th}$ frame period and before the gate driving circuit 200 generates the $1^{st}$ stage scan signals in the $(n+1)^{th}$ frame period, where n is an integer that is greater than or equal to 1 and less than or equal to (K-1). As shown in FIG. 8, the voltage level of the reset signal RST also switches after the gate driving circuit 200 scans the gate lines SL sequentially in the $K^{th}$ frame period. After the gate driving circuit 200 scans the gate lines SL sequentially in the $n^{th}$ frame period and before gate driving circuit 200 scans the gate lines SL in the $(n+1)^{th}$ frame period, regardless of whether the voltage levels of the nodes (e.g. the nodes X1($i$), X2($i$)) of any of the shift registers 210(1)-210(M) are kept at the predetermined low voltage level or are coupled by noise to generate ripples, in the invention, the transistors M14 in the reset units 340(1)-340(N) of the shift registers 210(1)-210(N) are turned on by the voltage level switch of the reset signal RST (e.g. rising from the low voltage level to the high-voltage level), and then the voltage levels of the nodes X1(1)-X1(N), X2(1)-X2(N) of the shift registers 210(1)-210(N) are set to be the predetermined disabling voltage level, so as to avoid affecting image display. Therefore, after the gate driving circuit 200 scans the gate lines SL sequentially in the $n^{th}$ frame period and before gate driving circuit 200 scans the gate lines SL in the $(n+1)^{th}$ frame period, the voltage levels of the nodes X1(1)-X1(N), X2(1)-X2(N) before the reset operation may be the same as those after the reset operation (e.g., the voltage levels of the nodes X1(1)-X1(N), X2(1)-X2(N) are non-interfered by noise), or alternatively the voltage levels of the nodes X1(1)-X1(N), X2(1)-X2(N) before the reset operation may be different from those after the reset operation (e.g., the voltage levels of the nodes X1(1)-X1(N) and/or the nodes X2(1)-X2(N) are coupled by noise, and the transistors M14 in the reset units 340(1)-340(N) of the shift registers 210(1)-210(N) are turned on by the voltage level switch of the reset signal RST, so as to set the voltage levels of the nodes X1(1)-X1(N), X2(1)-X2(N) to be the predetermined low voltage level). In other words, in this context, resetting the voltage levels of the nodes X1(1)-X1(N), X2(1)-X2(N) directs to enabling the reset units of the shirt registers, i.e., turning on the transistors M14 in the reset units 340(1)-340(N) of the shift registers 210(1)-210(N), so as to set the voltage levels of the nodes in the shift registers 210(1)-210(N) to be the disabling voltage level, regardless of whether the voltage levels of the voltage levels of the nodes X1(1)-X1(N), X2(1)-X2(N) before the reset operation are the same as those after the reset operation.

In this embodiment, the reference voltage levels respectively coupled to the reset units 340(1)-340(N) and coupled to the pull-down units 330(1)-330(N) are all VGL, but are limited thereto. In variant embodiments, the reference voltage levels respectively coupled to the reset units 340(1)-340(N) and coupled to the pull-down units 330(1)-330(N) are different. The timing sequences of the starting signal STV1, the clock signals C1-C4, the pull-down control signals GPWL1 and GPWL2, the $1^{st}$ to $N^{th}$ stage scan signals OUT(1)-OUT(N) and the ending signal STV2 during each of the $2^{nd}$ to $K^{th}$ frame periods are the same as those in the 1st frame period, and the reset signal RST is enabled after the ending signal STV2 rises form the low voltage level to the high voltage level and then falls from the high voltage level to the low voltage level during each frame period, i.e., the reset signal RST switches from the disabling voltage level (e.g. the low voltage level) to the enabling voltage level (e.g. the high voltage level), so as to reset the voltage levels of the nodes X1(1)-X1(N), X2(1)-X2(N) in the $1^{st}$ to $N^{th}$ stage shift registers 210(1)-210(N).

Figure 9:
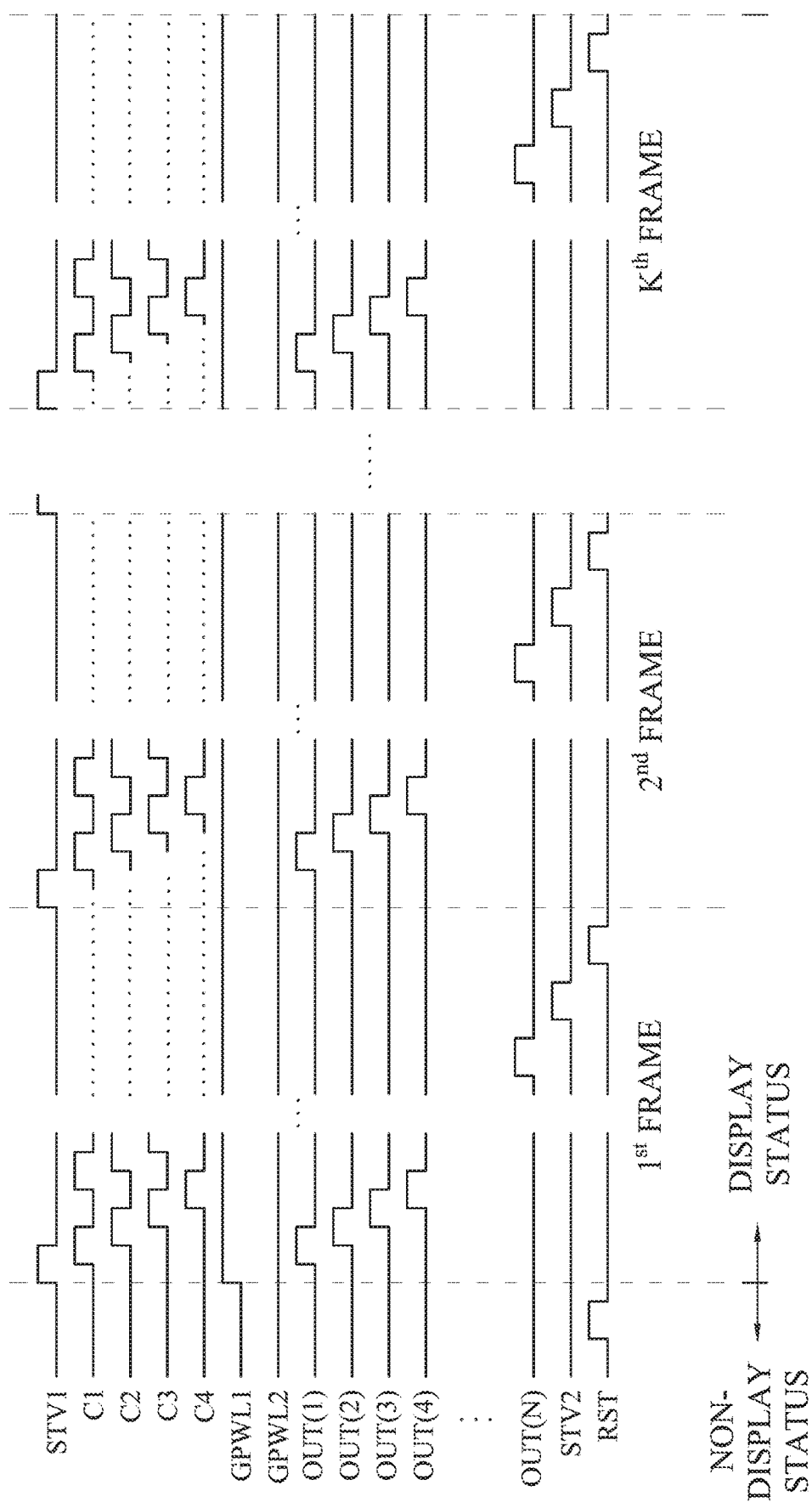
FIG. 9 is another exemplary time sequence diagram in accordance with the gate driving circuit in FIG. 3.

Moreover, in some embodiments, in order to ensure that the displayed image is normal during a power-off operation, when the display device 100 receives a power-off command, the voltage levels of at least some of the gate lines SL are enabling voltage levels, so as to turn on the corresponding thin film transistors TFT for at least some of the pixels PX to discharge, and preferably the voltage levels of all of the gate lines SL are enabling voltage levels for all of the pixels PX to discharge. However, the invention is not limited thereto. For example, the voltage levels of at least some of the starting signal STV1 and the clock signals C1-C4 are enabling voltage levels after the display device 100 receives a power-off command, such that the voltage levels of at least some of the gate lines SL are enabling voltage levels, thereby turning on the corresponding thin film transistors TFT for at least some of the pixels to discharge, but the invention is not limited thereto. It is noted that the enabling voltage levels of at least some of the starting signal STV1 and the clock signals C1-C4 after receiving a power-off command may be the same as or different from those in the frame period. For example, the enabling voltage levels of the starting signal STV1 and the clock signals C1-C4 after the display device 100 receives a power-off command may be lower than those in a frame period (e.g. a gate high voltage), as long as the enabling voltage levels can turn on the corresponding thin film transistors TFT to make the corresponding pixels PX discharge. FIG. 9 is another illustration of a time sequence diagram according to the gate driving circuit 200 in FIG. 3. The time sequence diagram shown in FIG. 9 is similar to that shown in FIG. 8. The difference between the time sequential diagrams in FIG. 8 and FIG. 9 is that, in FIG. 9, the reset signal RST rises from the low voltage level to the high voltage level before the display panel switches form the non-display status to the display status, such that the reset units 340(1)-340(N) of the $1^{st}$ to $N^{th}$ stage shift registers 210(1)-210(N) reset the voltage levels of the nodes X1(1)-X1(N) and X2(1)-X2(N) based on the reset signal RST. After resetting the voltage levels of the nodes, the reset signal RST falls from the high voltage level to the low voltage level, and subsequently the display panel switched to the display status and enters into the $1^{st}$ frame period. In other words, before the starting signal STV1 rises from the low voltage level to the high voltage level in the $1^{st}$ frame period, the voltage level change sequence of the reset signal RST is "low-high-low", i.e., the reset signal RST is enabled to reset the voltage levels of the nodes X1(1)-X1(N), X2(1)-X2(N) in the $1^{st}$ to $N^{th}$ stage shift registers 210(1)-210(N) before the display panel displays a first frame after the display panel switches form the non-display status to the display status. As such, the shift registers can be further prevented from being interfered by noise or being affected by abnormal input signals to output abnormal scan signals before the display panel switches form the non-display status to the display status, ensuring that the display panel does not display an abnormal image when switching from the non-display status to the display status. For example, the reset units 340(1)-340(N) of the $1^{st}$ to $N^{th}$ stage shift registers 210(1)-210(N) may reset the voltage levels of the nodes X1(1)-X1(N), X2(1)-X2(N) based on the reset signal RST before the display panel enters into the first frame period of the display status after powered on and/or switching into a restart mode from a sleep mode, but are not limited thereto.

It is noted that, in the embodiments of FIG. 8 and FIG. 9, after the $N^{th}$ stage scan signal OUT(N) is outputted and the ending signal STV2 rises from the low voltage level to the high voltage level and then falls from the high voltage level to the low voltage level, the reset signal RST rises from the low voltage level to the high voltage level, so as to reset the voltage levels of the nodes X1(1)-X1(N), X2(1)-X2(N) in the $1^{st}$ to $N^{th}$ stage shift registers 210(1)-210(N). However, the invention is not limited thereto. In variant embodiments, in a frame period, after the last stage scan signal is outputted, i.e., after the $N^{th}$ stage scan signal OUT(N) rises from the low voltage level to the high voltage level and then falls from the high voltage level to the low voltage level, the reset signal RST rises from the low voltage level to the high voltage level, so as to reset the voltage levels of the nodes X1(1)-X1(N), X2(1)-X2(N) in the $1^{st}$ to $N^{th}$ stage shift registers 210(1)-210(N).

In the embodiments of FIG. 8 and FIG. 9, after entering into the $1^{st}$ frame period, the pull-down control signal GPWL1 rises from the low voltage level to the high voltage level, while the pull-down control signal GPWL2 is at the low voltage level. However, the invention is not limited thereto. In other embodiments, after entering into the $1^{st}$ frame period, the pull-down control signal GPWL1 is at the low voltage level, while the pull-down control signal GPWL2 is at the high voltage level. It is noted that the periodical variations of the pull-down control signal GPWL1, GPWL2 are not shown in FIG. 8 and FIG. 9 when the display device is in the display status. The pull-down control signals GPWL1, GPWL2 are periodic signals, in which each period has an enabling voltage level (e.g. high voltage level) duration and a disabling voltage level (e.g. low voltage level) duration, i.e., the pull-down control signals GPWL1, GPWL2 are phase-inverted from each other when the display panel is in the display status, and the pull-down control signals GPWL1, GPWL2 are alternately enabled, i.e., one of the pull-down control signals GPWL1, GPWL2 is the enabling voltage level while at the same time the other is the disabling voltage level. For example, for a display panel with a frame rate of 60 frames per second (fps), the period of the pull-down control signals GPWL1, GPWL2 may be 2 seconds, in which both of the enabling voltage level duration and the disabling voltage level duration may be 1 second (i.e. 60 frame periods). As shown in FIG. 4A, FIG. 4B and FIG. 5, the two-stage shift registers 210($i$), 210($i$+1) share the two pull-down control units 330($i$), 330($i$+1) that are enabled respectively by the mutually phase-inverted pull-down control signals GPWL1, GPWL2. Therefore, when one of the pull-down units 330($i$), 330($i$+1) discharges the nodes X1($i$), X2($i$), X1($i$+1), X2($i$+1), the other does not discharge the nodes X1($i$), X2($i$), X1($i$+1), X2($i$+1), and the two pull-down units 330($i$), 330($i$+1) alternately discharge the nodes X1($i$), X2($i$), X1($i$+1), X2($i$+1). Therefore, the gates of the transistors M4-M7 in the pull-down unit 330($i$) and the gates of the transistors M4'-M7' in the pull-down control unit 330($i$+1) would not be biased at the high voltage levels for a long time, thereby avoiding threshold voltage shifts of the transistors M4-M7, M4'-M7' and thus improving the reliability of the gate driving circuit.

In addition, in the embodiments of FIG. 8 and FIG. 9, the high voltage level and the low voltage level for each signal are a relatively high voltage value and a relatively low voltage of the signal; the low voltage levels of different signals may be the same or different, and the high voltage levels of different signals may be the same or different. The low voltage level and the high voltage level of the starting signal STV1, the ending signal STV2, the pull-down control signals GPWL1, GPWL2, the $1^{st}$ to $N^{th}$ stage scan signals OUT(1)-OUT(N) and the reset signal RST may be respectively referred to as a disabling voltage level and an enabling voltage level of the corresponding signal. However, the invention is not limited thereto. For a variant embodiment of different type transistors (e.g. P-type TFTs), the high voltage level and the low voltage level of the starting signal STV1, the ending signal STV2, the pull-down control signals GPWL1, GPWL2, the $1^{st}$ to $N^{th}$ stage scan signals OUT(1)-OUT(N) and the reset signal RST may be respectively referred to as a disabling voltage level and an enabling voltage level of these signals for respectively turning on and turning off the corresponding transistors, i.e. the high voltage level and the low voltage level of the time sequence diagram in FIG. 8 and FIG. 9 are swapped, so as to obtain the time sequence diagram of the gate driving circuit corresponding to variant embodiments, and thus the description thereof is not described again herein.

Figure 10:
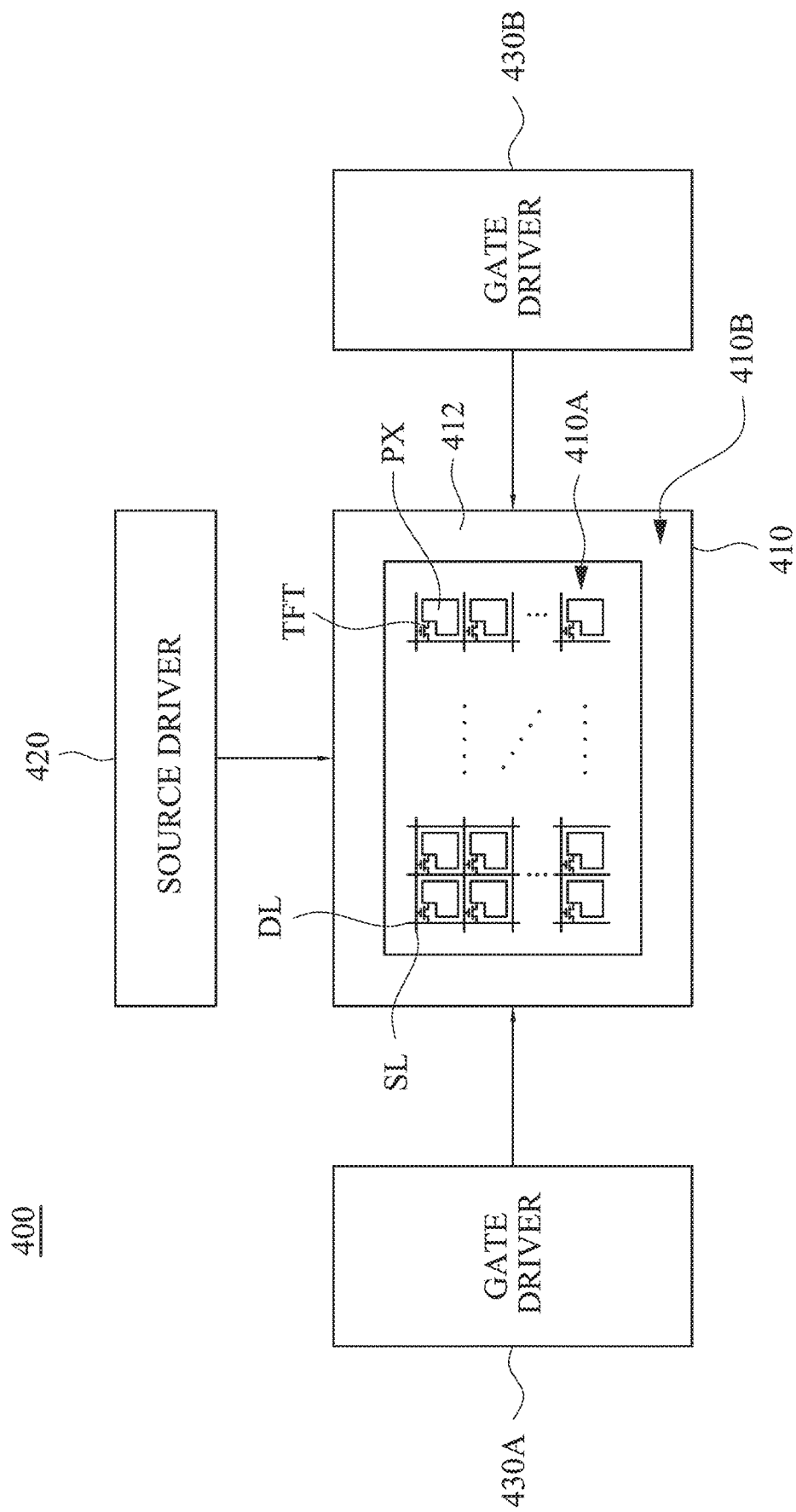
FIG. 10 is a schematic diagram of a display device in accordance with some embodiments of the invention.

Referring to FIG. 10, FIG. 10 is a schematic diagram of a display device 400. The display device 400 includes a display panel 410, a source driver 420 and gate drivers 430A, 430B. The display panel 410 has a display area 410A and a non-display area 410B. In the display area 410A, data lines DL, gate lines SL and pixels PX are formed on the substrate 412, and such pixels PX collectively display an image by the driving of the source driving signals and the gate driving signals. In the non-display area 4108, wirings (not shown) are respectively coupled to the source driver 420 and the gate drivers 430A, 430B, and are respectively coupled to the data lines DL and the gate lines SL in the display area 410A, so as to respectively send the source driving signals and the gate driving signals to thin film transistors TFT of the corresponding pixels PX, such that the pixels PX display corresponding gray levels in a particular time under the on-off switch control of the thin film transistors TFT. The display device 400 is similar to the display device 100 of FIG. 1. The difference between the display device 100 and the display device 400 is that the display device 400 includes two gate drivers 430A, 430B. As shown in FIG. 10, the gate drivers 430A, 430B are disposed at the left and right sides of the display panel 410, respectively, and collectively transmit gate driving signals to the display panel 410. In other embodiments, the disposal of the gate drivers 430A, 430B may be adjusted in accordance with various design requirements. The display panel 410 and the source driver 420 are approximately the same as the display panel 110 and the source driver 120 of FIG. 1, respectively, and the description is not described again herein.

Figure 11:
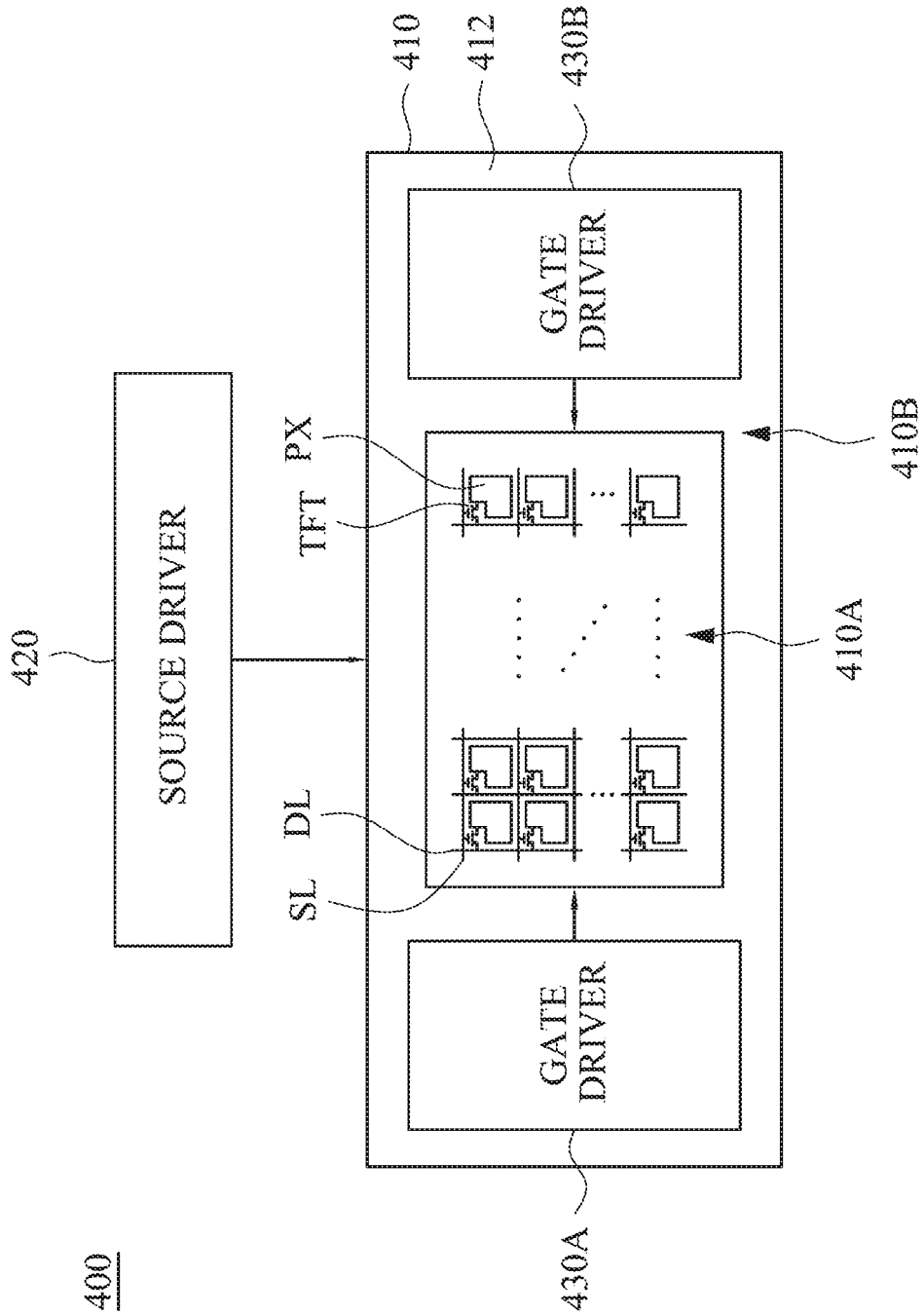
FIG. 11 is a schematic diagram of a display device in accordance with some embodiments of the invention.

Likewise, the source driver 420 and/or the gate drivers 430A, 4306 in FIG. 10 may be integrated in the display panel 410. As shown in FIG. 11, the display device 400 of the invention may be an SOG panel, in which the gate drivers 430A, 4306 are formed in the non-display area 4106 of the display panel 410. As such, the electrical components in the gate drivers 430, 4306 and the display area 410A may be formed simultaneously by the same process or processes. For example, the TFTs of the gate driving circuit in the gate drivers 430A, 4306 and the TFTs of the pixels in the display area 410A of the display panel 410 may be formed simultaneously by the same process or processes. In other embodiments, the source driver 420 may also be formed in the non-display area 4106 of the display panel 410, and the electrical components and wirings in the display panel 410, the source driver 420 and the gate drivers 430A, 4306 may be formed simultaneously by the same process or processes.

Figure 12:
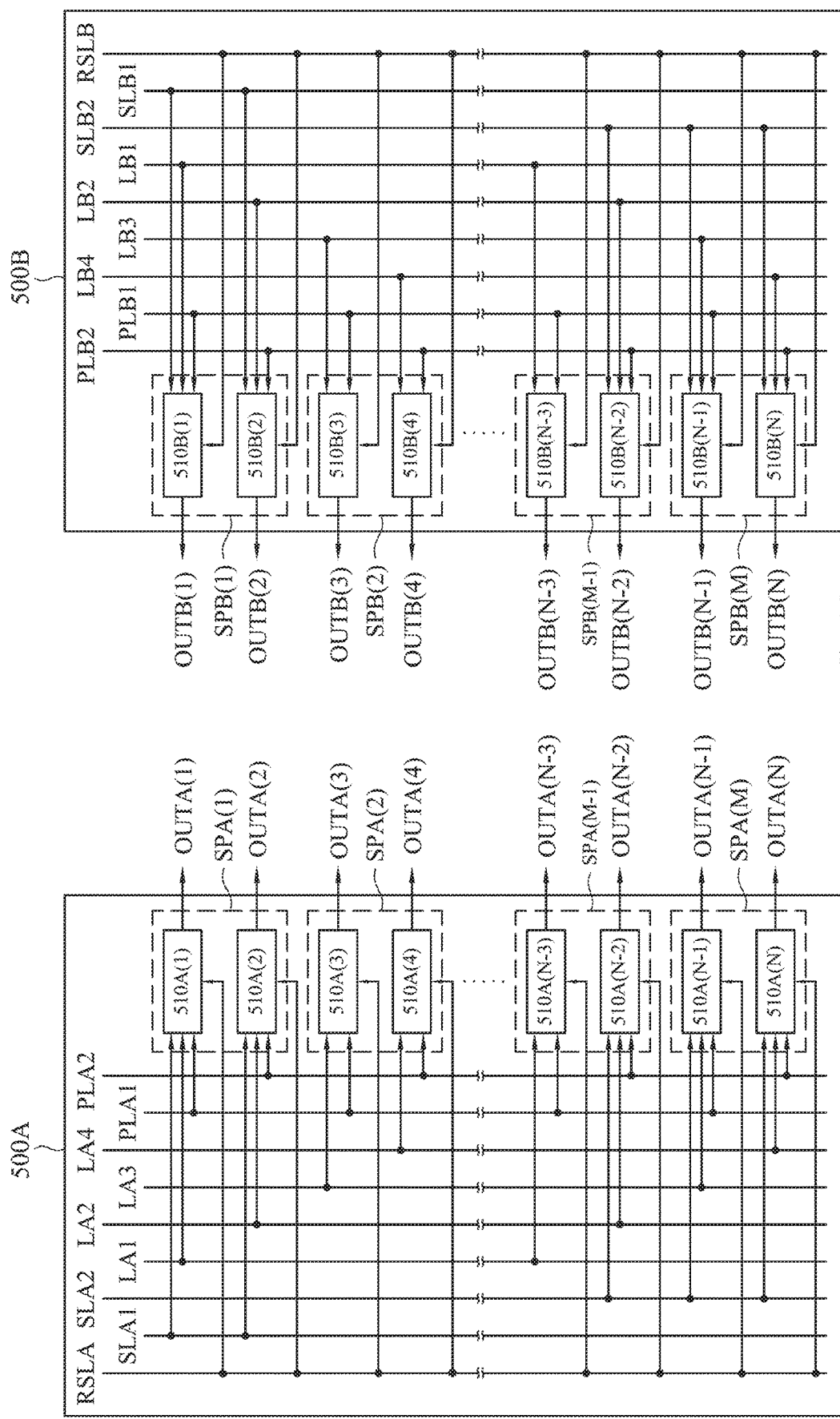
FIG. 12 is a schematic diagram of a gate driving circuit in accordance with some embodiments of the invention.

Referring to FIG. 12, which is a schematic diagram of gate driving circuits 500A, 5006 in accordance with some embodiments of the invention. The gate driving circuits 500A, 5006 may be applied to the display device 400 in FIG. 10 or FIG. 11, or another similar display device. In the following, the gate driving circuits 500A, 5006 applied to the display device 400 in FIG. 11 are exemplified for description. The gate driving circuits 500A, 5006 are parts of the gate drivers 430A, 4306, respectively, and respectively drive the pixels PX in the display area 410A at two opposite sides of the display panel 410, so as to enhance the driving ability to the display panel 410. The gate driving circuits 500A, 5006 may also be referred to as a first gate driving circuit and a second gate driving circuit, respectively. The gate driving circuits 500A, 5006 respectively include $1^{st}$ to $N^{th}$ stage shift registers 510A(1)-510A(N) and $1^{st}$ to $N^{th}$ stage shift registers 510B(1)-510B(N), where N is an integer greater than or equal to 4. The $1^{st}$ to $N^{th}$ stage shift registers 510A(1)-510A(N) and the $1^{st}$ to $N^{th}$ stage shift registers 510B(1)-510B(N) are a GOA structure. Further, N is an even number greater than 4, the equivalent circuit of each of the odd-numbered stage shift registers 510A(1), 510A(3), 510A(N−1), 510B(1), 510B(3), . . . , 510B(N−1) are the same as that of the shift register 210(i) in FIG. 4A, and the equivalent circuit of each of the even-numbered stage shift registers 510A(2), 510A(4), 510A(N), 510B(2), 510B(4), . . . , 510B(N) are the same as that of the shift register 210(i+1) in FIG. 4B. In addition, the shift registers 510A(1)-510A(N) sequentially form circuit pairs SPA(1)-SPA(M) in units of every two neighboring shift registers, and the shift registers 510B(1)-510B(N) sequentially form circuit pairs SPB(1)-SPB(M) in units of every two neighboring shift registers, where N is two times of M. The component layout of each of the circuit pairs SPA(1)-SPA(M), SPB(1)-SPB(M) may be the same as or similar to the transistor block and component layout of the circuit pair SP(j) shown in FIG. 6A and FIG. 6B. Therefore, the description regarding the equivalent circuit and component disposal of the shift registers 510A(1)-510A(N), 510B(1)-510B(N) can be referred to that in the preceding paragraphs in relation to FIG. 4A to FIG. 6B, and is not repeated herein.

In some embodiments, the gate driving circuit 500A further includes a starting signal line SLA1, clock signal lines LA1-LA4, an ending signal line SLA2, pull-down control signal lines PLA1, PLA2 and a reset signal line RSLA (also referred to as a first reset signal line), and the gate driving circuit 5006 further includes a starting signal line SLB1, clock signal lines LB1-LB4, an ending signal line SLB2, pull-down control signal lines PLB1, PLB2 and a reset signal line RSLB (also referred to as a second reset signal line). In some embodiments, N is a multiple of 4. The clock signal lines LA1-LA4, LB1-LB4 respectively provide clock signals C1-C4 to the corresponding shift registers 510A(1)-510A(N), 510B(1)-510B(N). Particularly, in a case where N is a multiple of 4, the clock signal line LA1 is coupled to the $1^{st}$ stage shift register 510A(1), the $5^{th}$ stage shift register 510A(5), . . . , and the $(N−3)^{th}$ stage shift register 510A(N−3), the clock signal line LB1 is coupled to the $1^{st}$ stage shift register 510B(1), the $5^{th}$ stage shift register 510B(5), . . . , and the $(N−3)^{th}$ stage shift registers 510B(N−3), the clock signal line LA2 is coupled to the $2^{nd}$ stage shift register 510A(2), the $6^{th}$ stage shift register 510A(6), and the $(N−2)^{th}$ stage shift register 510A(N−2), the clock signal line LB2 is coupled to the $2^{nd}$ stage shift register 510B(2), the $6^{th}$ stage shift register 510B(6), . . . , and the $(N−2)^{th}$ stage shift registers 510B(N−2), the clock signal line LA3 is coupled to the $3^{rd}$ stage shift register 510A(3), the $7^{th}$ stage shift register 510A(7), . . . , and the $(N−1)^{th}$ stage shift register 510A(N−1), the clock signal line LB3 is coupled to the $3^{rd}$ stage shift register 510B(3), the $7^{th}$ stage shift register 510B(7), ..., and the (N−1)$^{th}$ stage shift registers 510B(N−1), the clock signal line LA4 is coupled to the 4$^{th}$ stage shift register 510A(4), the 8$^{th}$ stage shift register 510A(8), ..., and the N$^{th}$ stage shift register 510A(N), the clock signal line LB4 is coupled to the 4$^{th}$ stage shift register 510B(4), the 8$^{th}$ stage shift register 510B(8), ..., and the N$^{th}$ stage shift registers 510B(N), where the clock signals C2, C3, C4 respectively lag the clock signals C1, C2, C3 by ¼ clock period.

In addition, the starting signal line SLA1 provides a starting signal STV1 to the 1$^{st}$ and 2$^{nd}$ stage shift registers 510A(1), 510A(2), the starting signal line SLB1 provides the starting signal STV1 to the 1$^{st}$ and 2$^{nd}$ stage shift registers 510B(1), 510B(2), the ending signal line SLA2 provides an ending signal STV2 to the (N−2)$^{th}$ to N$^{th}$ stage shift registers 510A(N−2)-510A(N), the ending signal line SLB2 provides the ending signal STV2 to the (N−2)$^{th}$ to N$^{th}$ stage shift registers 510B(N−2)-510B(N), the pull-down control signal line PLA1 provides the pull-down control signal GPWL1 to the odd-numbered stage shift registers 510A(1), 510A(3), 510A(N−1), the pull-down control signal line PLB1 provides the pull-down control signal GPWL1 to the odd-numbered stage shift registers 510B(1), 510B(3), ..., 510B(N−1), the pull-down control signal line PLA2 provides the pull-down control signal GPWL2 to the even-numbered stage shift registers 510A(2), 510A(4), 510A(N), the pull-down control signal line PLB2 provides the pull-down control signal GPWL2 to the even-numbered stage shift registers 510B(2), 510B(4), ..., 510B(N), the reset signal line RSLA provides the reset signal RST to all of the shift registers 510A(1)-510A(N) in the gate driving circuit 500A, and the reset signal line RSLB provides the reset signal RST to all of the shift registers 510B(1)-510B(N) in the gate driving circuit 500b. The starting signal lines SLA1, SLB1, the clock signal lines LA1-LA4, L61-L64, the ending signal lines SLA2, SLB2, the pull-down control signal lines PLA1, PLB1, PLA2, PLB2 and the reset signal lines RSLA, RSLB may be coupled to one or more chips. That is, the starting signal STV1, the clock signals C1-C4, the ending signal STV2, the pull-down control signals GPWL1, GPWL2 and the reset signal RST may be provided by the chip(s), such as a timing controller chip or a driving circuit, but are not limited thereto.

The 1$^{st}$ to N$^{th}$ stage shift registers 510A(1)-510A(N) and the 1$^{st}$ to N$^{th}$ stage shift registers 510B(1)-510B(N) respectively generate 1$^{st}$ to N$^{th}$ stage scan signals OUTA(1)-OUTA(N) and 1$^{st}$ to N$^{th}$ stage scan signals OUTB(1)-OUTB(N) to the corresponding 1$^{st}$ to N$^{th}$ gate lines, i.e., the two ends of each of the gate lines are electrically connected to the corresponding shift registers in the gate driving circuits 500A, 500б, respectively. For example, the two terminals of the i$^{th}$ gate line are electrically connected to the i$^{th}$ stage shift registers 510A(i), 510B(i), respectively. In other words, each gate line is driven simultaneously by two corresponding shift registers to improve the gate line voltage level driving ability, i.e., to switch the voltage level of the gate lines from a disabling voltage level (e.g. low voltage level) to an enabling voltage level (e.g. high voltage level) rapidly. In the gate driving circuit 500A, the 1$^{st}$ to 3$^{rd}$ stage scan signals OUTA(1)-OUTA(3) are respectively inputted to the 3$^{rd}$-5$^{th}$ stage shift registers 510A(3)-510A(5), the (N−1)$^{th}$ and N$^{th}$ stage scan signals OUTA(N−1), OUTA(N) are respectively inputted to the (N−4)$^{th}$ and (N−3)$^{th}$ stage shift registers 510A(N−4), 510A(N−3), and each of the 4$^{th}$ to (N−2)$^{th}$ stage scan signals OUTA(4)-OUTA(N−2) is inputted to the shift registers previous three stage of shift register thereto and next two stage of shift register thereto. For illustration, the 4$^{th}$ stage scan signal OUTA(4) is inputted to the 1$^{st}$ and 6$^{th}$ shift registers 510A(1), 510A(6). Likewise, in the gate driving circuit 500B, the 1$^{st}$ to 3$^{rd}$ stage scan signals OUTB(1)-OUTB(3) are respectively inputted to the 3$^{rd}$-5$^{th}$ stage shift registers 510B(3)-510B(5), the (N−1)$^{th}$ and N$^{th}$ stage scan signals OUTB(N−1), OUTB(N) are respectively inputted to the (N−4)$^{th}$ and (N−3)$^{th}$ stage shift registers 510B(N−4), 510B(N−3), and each of the 4$^{th}$ to (N−2)$^{th}$ stage scan signals OUTB(4)-OUTB(N−2) is inputted to the shift registers previous three stage of shift register thereto and next two stage of shift register thereto.

The same stage of those among the scan signals OUTA(1)-OUTA(N), OUTB(1)-OUTB(N) have the same waveform time sequential diagram, i.e., the 1$^{st}$ stage scan signals OUTA(1), OUTB(1) have the same waveform time sequential diagram, the 2$^{nd}$ stage scan signals OUTA(2), OUTB(2) have the same waveform time sequential diagram, ... and the like. In addition, the starting signal STV1, the clock signals C1-C4, the pull-down control signals GPWL1, GPWL2, the ending signal STV2, the reset signal RST and the 1$^{st}$ to N$^{th}$ stage scan signals OUTA(1)-OUTA(N)/OUTB(1)-OUTB(N) in the gate driving circuit 500A/500B may respectively have the same waveform time sequential diagrams as those of the starting signal STV1, the clock signals C1-C4, the pull-down control signal GPWL1, GPWL2, the ending signal STV2, the reset signal RST and the 1$^{st}$ to N$^{th}$ stage scan signals OUT(1)-OUT(N) in the gate driving circuit 200, and thus the related descriptions thereof can refer to the preceding paragraphs, which are not repeated herein.

In summary, the gate driving circuit of the invention and the display panel with such gate driving circuit have voltage level reset function and are able to prevent the shift registers from being affected by noise interferences to output abnormal scan signals, ensuring that the display panel displays correct images in each frame period.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A gate driving circuit, comprising:
   1$^{st}$ to N$^{th}$ stage shift registers configured to respectively provide 1$^{st}$ to N$^{th}$ stage scan signals to 1$^{st}$ to N$^{th}$ gate lines of a display panel, wherein N is an integer greater than or equal to 4;
   wherein an m$^{th}$ stage shift register of the 1$^{st}$ to N$^{th}$ stage shift registers comprises an m$^{th}$ main circuit, an m$^{th}$ discharge circuit, a first node and a second node;
   wherein the m$^{th}$ main circuit comprises:
   an m$^{th}$ pre-charge unit that is coupled to the first node of the m$^{th}$ stage shift register and is configured to output a pre-charge signal to the first node of the m$^{th}$ stage shift register;
   an m$^{th}$ pull-up unit that is coupled to the first node and the second node of the m$^{th}$ stage shift register, and is configured to output an m$^{th}$ stage scan signal of the 1$^{st}$ to N$^{th}$ stage scan signals to the second node of the m$^{th}$ stage shift register; and an $m^{th}$ reset unit that is coupled to the first node of the $m^{th}$ stage shift register and is configured to receive a reset signal;

and the $m^{th}$ discharge circuit comprises:

an $m^{th}$ pull-down unit that is coupled to the first node and the second node of the $m^{th}$ stage shift register, and is configured to receive one of a first pull-down control signal and a second pull-down control signal, wherein the first pull-down control signal and the second pull-down control signal are phase-inverted with respect to each other during an image display period of the display panel;

wherein m is an integer that is greater than or equal to 1 and less than or equal to N;

wherein an $i^{th}$ pull-down unit is configured to receive the first pull-down control signal, and an $(i+1)^{th}$ pull-down unit is configured to receive the second pull-down control signal, wherein i is an odd number greater than or equal to 1 and less than or equal to N.

2. The gate driving circuit of claim 1, wherein an $i^{th}$ main circuit is coupled to an $(i+1)^{th}$ discharge circuit, and an $i^{th}$ discharge circuit is coupled to an $(i+1)^{th}$ main circuit.

3. The gate driving circuit of claim 2, wherein the $(i+1)^{th}$ discharge circuit is coupled to the first node and the second node of the $i^{th}$ stage shift register, and the $i^{th}$ discharge circuit is coupled to the first node and the second node of the $(i+1)^{th}$ stage shift register.

4. The gate driving circuit of claim 1, wherein the $m^{th}$ reset unit is configured to reset a voltage level of the first node of the $m^{th}$ stage shift register after the gate driving circuit generates the $1^{st}$ to $N^{th}$ stage scan signals.

5. The gate driving circuit of claim 4, wherein the $m^{th}$ reset unit is configured to reset the voltage level of the first node of the $m^{th}$ stage shift register after the gate driving circuit generates the $1^{st}$ to $N^{th}$ stage scan signals in a $j^{th}$ frame period and before the gate driving circuit generates the $1^{st}$ stage scan signals in a $(j+1)^{th}$ frame period, wherein j is integer that is greater than or equal to 1.

6. The gate driving circuit of claim 1, wherein the $m^{th}$ reset unit is configured to reset a voltage level of the first node of the $m^{th}$ stage shift register before the display panel displays a first frame after the display panel enters a display status.

7. The gate driving circuit of claim 1, wherein the $m^{th}$ precharge unit comprises:

a first transistor, wherein a control terminal of the first transistor is configured to receive a first input signal, a first terminal of the first transistor is configured to receive a first reference voltage level, and a second terminal of the first transistor is coupled to the first node of the $m^{th}$ stage shift register; and a second transistor, wherein a control terminal of the second transistor is configured to receive a second input signal, a first terminal of the second transistor is configured to receive a second reference voltage level, and a second terminal of the second transistor is coupled to the first node of the $m^{th}$ stage shift register.

8. The gate driving circuit of claim 7, wherein when m is any integer of 1 to 2, the first input signal is a starting signal, and the second input signal is an $(m+3)^{th}$ stage scan signal of the $1^{st}$ to $N^{th}$ stage scan signals;

when m is any integer of 3 to (N−3), the first input signal is an $(m−2)^{th}$ stage scan signal of the $1^{st}$ to $N^{th}$ stage scan signals, and the second input signal is an $(m+3)^{th}$ stage scan signal of the $1^{st}$ to $N^{th}$ stage scan signals;

when m is any integer of (N−2) to N, the first input signal is an $(m−2)^{th}$ stage scan signal of the $1^{st}$ to $N^{th}$ stage scan signals, and the second input signal is an ending signal.

9. The gate driving circuit of claim 7, wherein the $m^{th}$ pull-up unit comprises:

a third transistor, wherein a control terminal of the third transistor is coupled to the first node of the $m^{th}$ stage shift register, a first terminal of the third transistor is configured to receive a clock signal, and a second terminal of the third transistor is configured to output the $m^{th}$ stage scan signal.

10. The gate driving circuit of claim 1, wherein the $m^{th}$ reset unit comprises:

a reset transistor, wherein a control terminal of the reset transistor is configured to receive the reset signal, a first terminal of the reset transistor is configured to receive a reference voltage level, and a second terminal of the reset transistor is coupled to the first node of the $m^{th}$ stage shift register.

11. A display panel having a display area and a non-display area, the display panel comprising:

a substrate;

$1^{st}$ to $N^{th}$ gate lines disposed on the substrate and in the display area;

a first gate driving circuit disposed on the substrate and in the non-display area, the first gate driving circuit comprising $1^{st}$ to $N^{th}$ stage shift registers that are configured to respectively provide $1^{st}$ to $N^{th}$ stage first scan signals to the $1^{st}$ to $N^{th}$ gate lines in the display area, wherein N is an integer greater than or equal to 4; and a first reset signal line disposed on the substrate and in the non-display area, the first reset signal line coupled to the $1^{st}$ to $N^{th}$ stage shift registers;

wherein an $m^{th}$ stage shift register of the $1^{st}$ to $N^{th}$ stage shift registers comprises an $m^{th}$ main circuit, an $m^{th}$ discharge circuit and a wiring;

wherein the $m^{th}$ main circuit comprises:

an $m^{th}$ pre-charge unit that is coupled to a first node of the $m^{th}$ stage shift register and is configured to output a pre-charge signal to the first node of the $m^{th}$ stage shift register, the $m^{th}$ precharge unit comprising:

a first transistor that is configured to receive a first input signal, and is coupled to the first node of the $m^{th}$ stage shift register; and a second transistor that is configured to receive a second input signal, and is coupled to the first node of the $m^{th}$ stage shift register;

an $m^{th}$ pull-up unit that is coupled to the first node and a second node of the $m^{th}$ stage shift register and is configured to output an $m^{th}$ stage first scan signal of the $1^{st}$ to $N^{th}$ stage first scan signals to the second node of the $m^{th}$ stage shift register, the $m^{th}$ pull-up unit comprising:

a third transistor that is coupled to the first node and the second node of the $m^{th}$ stage shift register, and is configured to receive a clock signal and output the $m^{th}$ first scan signal; and an $m^{th}$ reset unit that is coupled to the first node of the $m^{th}$ stage shift register, wherein the first reset signal line is configured to provide a reset signal to the $m^{th}$ reset unit, the $m^{th}$ reset unit comprising:

a reset transistor that is coupled to the first node of the $m^{th}$ stage shift register and is configured to receive the reset signal, wherein the reset transistor is disposed between the second transistor and the third transistor;

and the $m^{th}$ discharge circuit comprises:
- an $m^{th}$ pull-down unit that is coupled to the first node and the second node of the $m^{th}$ stage shift register and is configured to receive a pull-down control signal;

wherein m is an integer that is greater than or equal to 1 and less than or equal to N;

wherein the wiring of the $m^{th}$ stage shift register is disposed between the reset signal line and a control terminal of the reset transistor of the $m^{th}$ stage shift register and is electrically connected to the first reset signal line and the control terminal of the reset transistor of the $m^{th}$ stage shift register, and the wiring of the $m^{th}$ stage shift register and the first reset signal line are formed from different metal layers.

12. The display panel of claim 11, wherein an $i^{th}$ main circuit is coupled to an $(i+1)^{th}$ discharge circuit, and an $i^{th}$ discharge circuit is coupled to an $(i+1)^{th}$ main circuit, wherein i is an odd number greater than or equal to 1 and less than or equal to N.

13. The display panel of claim 11, wherein the first reset signal line is disposed between the display area and the $1^{st}$ to $N^{th}$ stage shift registers.

14. The display panel of claim 11, further comprising:
a second gate driving circuit and a second reset signal line disposed on the substrate and in the non-display area, the first gate driving circuit and the second gate driving circuit disposed respectively at two opposite sides of the display panel, and the first reset signal line and the second reset signal line disposed respectively at two opposite sides of the display panel;

wherein the first gate driving circuit and the second gate driving circuit have the same circuit, the second reset signal line is coupled to $1^{st}$ to $N^{th}$ stage shift registers of the second gate driving circuit, and the second gate driving circuit is configured to provide $1^{st}$ to $N^{th}$ stage second scan signals to the $1^{st}$ to $N^{th}$ gate lines;

wherein one end and the other end of each of the $1^{st}$ to $N^{th}$ gate lines are respectively coupled to the first gate driving circuit and the second gate driving circuit, and waveforms and time sequences of the $1^{st}$ to $N^{th}$ stage first scan signals are respectively the same as waveforms and time sequences of the $1^{st}$ to $N^{th}$ stage second scan signals.

15. A gate driving circuit, comprising:
$1^{st}$ to $N^{th}$ stage shift registers configured to respectively provide $1^{st}$ to $N^{th}$ stage scan signals to $1^{st}$ to $N^{th}$ gate lines of a display panel, wherein N is an integer greater than or equal to 4;

wherein an $i^{th}$ stage shift register of the $1^{st}$ to $N^{th}$ stage shift registers comprises an $i^{th}$ main circuit and an $i^{th}$ discharge circuit, an $(i+1)^{th}$ stage shift register of the $1^{st}$ to $N^{th}$ stage shift registers comprises an $(i+1)^{th}$ main circuit and an $(i+1)^{th}$ discharge circuit, the $i^{th}$ main circuit is coupled to the $i^{th}$ discharge circuit and the $(i+1)^{th}$ discharge circuit, and the $(i+1)^{th}$ main circuit is coupled to the $i^{th}$ discharge circuit and the $(i+1)^{th}$ discharge circuit;

wherein the $i^{th}$ main circuit comprises:
- an $i^{th}$ pre-charge unit that is coupled to a first node of the $i^{th}$ stage shift register and is configured to output an $i^{th}$ pre-charge signal to the first node of the $i^{th}$ stage shift register;
- an $i^{th}$ pull-up unit that is coupled to the first node and a second node of the $i^{th}$ stage shift register and is configured to output an $i^{th}$ stage scan signal of the $1^{st}$ to $N^{th}$ stage scan signals to the second node of the $i^{th}$ stage shift register; and
- an $i^{th}$ reset unit that is configured to receive the reset signal and is coupled to the first node of the $i^{th}$ reset unit;

wherein the $(i+1)^{th}$ main circuit comprises:
- an $(i+1)^{th}$ pre-charge unit that is coupled to a first node of the $(i+1)^{th}$ stage shift register and is configured to output an $(i+1)^{th}$ pre-charge signal to the first node of the $(i+1)^{th}$ stage shift register; and
- an $(i+1)^{th}$ pull-up unit that is coupled to the first node and a second node of the $(i+1)^{th}$ stage shift register and is configured to output an $(i+1)^{th}$ stage scan signal of the $1^{st}$ to $N^{th}$ stage scan signals to the second node of the $(i+1)^{th}$ stage shift register; and
- an $(i+1)^{th}$ reset unit that is configured to receive the reset signal and is coupled to the first node of the $(i+1)^{th}$ reset unit;

wherein i is an odd number greater than or equal to 1 and less than or equal to N;

wherein the $i^{th}$ discharge circuit is coupled to the first node and the second node of the $i^{th}$ main circuit and the first node and the second node of the $(i+1)^{th}$ main circuit, and the $(i+1)^{th}$ discharge circuit is coupled to the first node and the second node of the $i^{th}$ main circuit, and the first node and the second node of the $(i+1)^{th}$ main circuit.

* * * * *